(12) United States Patent
Bazan et al.

(10) Patent No.: US 9,017,766 B2
(45) Date of Patent: *Apr. 28, 2015

(54) METHODS AND DEVICES COMPRISING SOLUBLE CONJUGATED POLYMERS

(75) Inventors: Guillermo C. Bazan, Santa Barbara, CA (US); Bin Liu, Goleta, CA (US); Xiong Gong, Goleta, CA (US); Alan J. Heeger, Santa Barbara, CA (US); Wanli Ma, Goleta, CA (US); Parameswar K. Iyer, Assam (IN)

(73) Assignee: The Regents of the University of California, Oakland, CA (US)

( * ) Notice: Subject to any disclaimer, the term of this patent is extended or adjusted under 35 U.S.C. 154(b) by 1235 days.

This patent is subject to a terminal disclaimer.

(21) Appl. No.: 10/595,179

(22) PCT Filed: Sep. 17, 2004

(86) PCT No.: PCT/US2004/030566
§ 371 (c)(1),
(2), (4) Date: Aug. 21, 2006

(87) PCT Pub. No.: WO2005/056628
PCT Pub. Date: Jun. 23, 2005

(65) Prior Publication Data
US 2007/0274357 A1 Nov. 29, 2007

Related U.S. Application Data

(63) Continuation-in-part of application No. 10/666,333, filed on Sep. 17, 2003, now Pat. No. 7,144,950.

(60) Provisional application No. 60/607,335, filed on Sep. 3, 2004.

(51) Int. Cl.
*B05D 3/02* (2006.01)
*H01L 51/00* (2006.01)
(Continued)

(52) U.S. Cl.
CPC ............ *H01L 51/0003* (2013.01); *C08G 61/02* (2013.01); *C08G 61/10* (2013.01);
(Continued)

(58) Field of Classification Search
USPC .......................................... 427/384, 58, 407.1
See application file for complete search history.

(56) References Cited

U.S. PATENT DOCUMENTS

| 4,948,843 A | 8/1990 | Roberts et al. |
| 4,950,587 A | 8/1990 | Roberts et al. |

(Continued)

FOREIGN PATENT DOCUMENTS

| DE | 19507413 | 11/1995 |
| JP | 2003-077673 | 3/2003 |

(Continued)

OTHER PUBLICATIONS

Chen et al. "Structures and Properties of the Water-Soluble Self-Acid-Doped Conducting Polymer Blends: Sulfonic Acid Ring-Substituted Polyaniline/Poly(vinyl alcohol) and Poly(aniline-co-N-propanesulfonic acid aniline)/Poly(vinyl alcohol)" Polymer vol. 38, No. 13 pp. 3333-3346.*

(Continued)

*Primary Examiner* — Robert S Walters, Jr.
(74) *Attorney, Agent, or Firm* — Gates & Cooper LLP

(57) ABSTRACT

Methods, compositions and articles of manufacture involving soluble conjugated polymers are provided. The conjugated polymers have a sufficient density of polar substituents to render them soluble in a polar medium, for example water and/or methanol. The conjugated polymer may desirably comprise monomers which alter its conductivity properties. In some embodiments, the inventors have provided cationic conjugated polymers (CCPs) comprising both solubilizing groups and conductive groups, resulting in conductive conjugated polymers soluble in polar media. The different solubility properties of these polymers allow their deposition in solution in multilayer formats with other conjugated polymers. Also provided are articles of manufacture comprising multiple layers of conjugated polymers having differing solubility characteristics. Embodiments of the invention are described further herein.

11 Claims, 6 Drawing Sheets

(51) Int. Cl.

| | | |
|---|---|---|
| C08G 61/02 | (2006.01) | |
| C08G 61/10 | (2006.01) | |
| C08G 61/12 | (2006.01) | |
| C08G 73/02 | (2006.01) | |
| C08G 73/08 | (2006.01) | |
| H01B 1/12 | (2006.01) | |
| H01L 51/56 | (2006.01) | |
| H01S 3/16 | (2006.01) | |

(52) U.S. Cl.
CPC ........... *C08G 61/123* (2013.01); *C08G 61/126* (2013.01); *C08G 73/02* (2013.01); *C08G 73/08* (2013.01); *H01B 1/127* (2013.01); *H01B 1/128* (2013.01); *H01L 51/0007* (2013.01); *H01L 51/0036* (2013.01); *H01L 51/0038* (2013.01); *H01L 51/0039* (2013.01); *H01L 51/0043* (2013.01); *H01L 51/56* (2013.01); *H01S 3/168* (2013.01)

(56) References Cited

U.S. PATENT DOCUMENTS

| | | |
|---|---|---|
| 5,189,136 A | 2/1993 | Wudl et al. |
| 5,408,109 A | 4/1995 | Heeger et al. |
| 5,612,221 A | 3/1997 | Simons et al. |
| 5,766,515 A | 6/1998 | Jonas et al. |
| 5,869,350 A | 2/1999 | Heeger et al. |
| 5,881,083 A | 3/1999 | Diaz-Garcia et al. |
| 5,900,327 A | 5/1999 | Pei et al. |
| 5,968,762 A | 10/1999 | Jadamec et al. |
| 5,990,479 A | 11/1999 | Weiss et al. |
| 6,083,635 A | 7/2000 | Jonas et al. |
| 6,280,933 B1 | 8/2001 | Glazer et al. |
| 6,476,184 B1 | 11/2002 | Janietz et al. |
| 6,534,329 B2 | 3/2003 | Heeger et al. |
| 6,558,219 B1 | 5/2003 | Burroughs et al. |
| 6,692,663 B2 | 2/2004 | Zhou |
| 6,743,640 B2 | 6/2004 | Whitten |
| 6,849,869 B1 | 2/2005 | O'Regan et al. |
| 6,869,695 B2 | 3/2005 | Thompson et al. |
| 6,872,474 B2 | 3/2005 | Sakakibara et al. |
| 6,999,222 B2 | 2/2006 | Bazan et al. |
| 7,009,338 B2 | 3/2006 | D'Andrade et al. |
| 7,144,950 B2 | 12/2006 | Bazan et al. |
| 7,351,754 B2 | 4/2008 | Nakano et al. |
| 7,830,085 B2 | 11/2010 | Gong et al. |
| 8,076,842 B2 | 12/2011 | Gong et al. |
| 2002/0009728 A1 | 1/2002 | Bittner |
| 2002/0022689 A1 | 2/2002 | Menon |
| 2002/0034747 A1 | 3/2002 | Bruchez |
| 2002/0064680 A1 | 5/2002 | Spreitzer et al. |
| 2002/0125819 A1 | 9/2002 | Mishima |
| 2002/0150759 A1 | 10/2002 | Jones |
| 2002/0177136 A1 | 11/2002 | McBranch |
| 2003/0054413 A1 | 3/2003 | Kumaraswamy |
| 2003/0059975 A1* | 3/2003 | Sirringhaus et al. ............ 438/99 |
| 2003/0088032 A1 | 5/2003 | Luebben et al. |
| 2003/0164477 A1 | 9/2003 | Zhou et al. |
| 2003/0205696 A1 | 11/2003 | Thoms et al. |
| 2003/0222250 A1* | 12/2003 | Hsu .............................. 252/500 |
| 2003/0227509 A1 | 12/2003 | Usuda |
| 2004/0094768 A1 | 5/2004 | Yu et al. |
| 2004/0110031 A1 | 6/2004 | Fukuda et al. |
| 2004/0166366 A1 | 8/2004 | Cho et al. |
| 2004/0241768 A1 | 12/2004 | Whitten |
| 2005/0073245 A1 | 4/2005 | Gong et al. |
| 2006/0054886 A1 | 3/2006 | Bazan et al. |
| 2006/0247384 A9 | 11/2006 | Bazan et al. |
| 2007/0274357 A1 | 11/2007 | Bazan |

FOREIGN PATENT DOCUMENTS

| | | |
|---|---|---|
| JP | 2003-251832 | 9/2003 |
| JP | 2003-257647 | 9/2003 |
| JP | 2003-347061 | 12/2003 |
| JP | 2004-002703 | 1/2004 |
| WO | WO 97/33323 | 9/1997 |
| WO | WO 99/35288 | 7/1999 |
| WO | WO 00/14278 | 3/2000 |
| WO | WO 00/66790 | 11/2000 |
| WO | WO01/77203 | 10/2001 |
| WO | WO 02/081735 | 10/2002 |
| WO | WO/04/001379 | 12/2003 |
| WO | WO2004/037886 | 5/2004 |
| WO | WO2005/056628 | 6/2005 |

OTHER PUBLICATIONS

Lukkari et al. "Polyelectrolyte Multilayers Prepared from Water-Soluble Poly(alkoxythiophene) Derivatives" J. Am. Chem. Soc. 2001, 123, 6083-6091.*

Balakin, K.V. et al. Conjugates of oligonucleotides with polyaromatic fluorophores as promising DNA probes[1] *Biosensors and Bioelectronics* (1998) 13:771-778.

Bardea, A. et al. Sensing and amplification of oligonucleotide-DNA interactions by means of impedance spectroscopy: a route to a Tay-Sachs sensor, *Chem. Commun.* (1999) 21-22.

Baur, J.W., et al. Thin-Film Light-Emitting Devices Based on Sequentially Adsorbed Multilayers of Water-Soluble Poly (p-phenylene)s; *Advanced Materials* (1998) 10:17:1452-1455.

Behr, J.P. Synthetic Gene-Transfer Vectors; *Acc. Chem. Res.* (1993) 26: 274-278.

Behr, J.P. DNA Strongly Binds to Micelles and Vesicies Containing Lipopolyamines or Lipointercalants; *Tetrahedron Lett.* (1986) 27:48:5861-5864.

Benson, S.C. et al. Heterodimeric DNA-binding dyes designed for energy transfer: synthesis and spectroscopic properties; *Nucleic Acids Res.* (1993) 21:24:5727-5735.

Betts, L, et al. A Nucleic Acid Triple Helix Formed by a Peptide Nucleic Acid-DNA Complex; *Science* (1995) 270: 1838-1841.

Bhattacharya, S. and Mandal, S.S. Interaction of surfactants with DNA. Role of hydrophobicity and surface charge on intercalation and DNA melting; *Biochim.et Biophys. Acta.* (1997) 1323:29-44.

Bhattacharya; S. and Mandal, S.S. Role of hydrophobic effect and surface charge in surfactant-DNA association; *Indian J. Biochem. & Biophys.* (1997) 34:11-17.

Bier, F.F. and Kleinjung, F. Feature-size limitations of microarray technology—a critical review, *Fresenius J. Anal. Chem.* (2001) 371:151-156.

Birnboim, H.C. and Jevcak, J.J. Fluorometric Method for Rapid Detection of DNA Strand Breaks in Human White Blood Cells Produced by Low Doses of Radiation; *Cancer Res.* (1981) 41:1889-1892.

Blessing, T. et al. Monomolecular collapse of plasmid DNA into stable virus-like particles; *Proc. Natl. Acad. Sci. USA* (1998) 95:1427-1431.

Bronich, T.K. et al. Recognition of DNA Topology in Reactions between Plasmid DNA and Cationic Copolymers; *J. Am. Chem. Soc.* (2000) 122:35:8339-8343.

Cardullo, R.A. et al. Detection of nucleic acid hybridization by nonradiative fluorescence resonance energy transfer; *Proc. Natl. Acad. Sci. USA* (1988) 85:8790-8794.

Castro, A. and Williams, J.G.K. Single-molecule detection of specific nucleic acid sequences in unamplified genomic DNA; *Anal. Chem.* (1997) 69:19:3915-3920.

Chandar, P. et al. fluorescence probe investigation of anionic polymer-cationic surfactant interactions; *Macromolecules* (1988) 21:950-953.

Chehab, F.F. and Kan, Y.W. Detection of specific DNA sequences by fluorescence amplification: A color complementation assay; *Proc. Natl. Acad. Sci. USA* (1989) 86:9178-9182.

Chen, L. and Frankel, A.D. A peptide interaction in the major groove of RNA resembles protein interactions in the minor groove of DNA; *Proc. Natl. Acad. Sci. USA*. (1995) 92:5077-5081.

(56) References Cited

OTHER PUBLICATIONS

Chen, L. et al. Highly sensitive biological and chemical sensors based on reversible fluorescence quenching in a conjugated polymer; *Proc. Natl. Acad. Sci. USA.* (1999) 96:22:12287-12292.

Chen, W. et al. Using Ethidium Bromide to Probe the Interactions between DNA and Dendrimers; *Langmuir* (2000) 16:15-19.

Delling, U. et al. The number of positively charged amino acids in the basic domain of Tat is critical for trans-activation and complex formation with TAR RNA; *Proc. Natl. Acad. Sci. USA* (1991) 88:6234-6238.

Demidov, V.V. PNA and LNA throw light on DNA; *Trends in Biotechnology* (2003) 21:1:4-7.

Demidov, V.V. et al. Stability of peptide nucleic acids in human serum and cellular extracts; *Biochem. Pharmacol.* (1994) 48:6:1310-1313.

Didenko, V.V. DNA Probes Using Fluorescence Resonance Energy Transfer (FRET): Designs and Applications; *BioTechniques* (2001) 31:5:1106-1121.

Dogariu, A. et al. Time-resolved Förster energy transfer in polymer blends; *Synthetic Metals* (1999) 100:95-100.

Dufourcq, J. et al. Molecular assembling of DNA with amphipathic peptides; *FEBS Lett.* (1998) 421:7-11.

Eastman, S.J. et al. Biophysical characterization of cationic lipid: DNA complexes; *Biochim. et Biophys. Acta* (1997) 1325:41-62.

Egholm, M. et al. PNA hybridizes to complementary oligonucleotides obeying the Watson-Crick hydrogenbonding rules; *Nature* (1993) 365:566-568.

Egholm, M. et al. Recognition of Guanine and Adenine in DNA by Cytosine and Thymine Containing Peptide Nucleic Acids (PNA); *J. Am. Chem. Soc.* (1992) 114:9677-9678.

Englebienne, P. Synthetic materials capable of reporting biomolecular recognition events by chromic transition; *J. Mater Chem.* (1999) 9:1043-1054.

Eskilsson, K. et al. DNA-Surfactant Complexes at Solid Surfaces; *Langmuir* (2001) 17:1666-1669.

Felgner, P.L. et al. Nomenclature for Synthetic Gene Delivery Systems; *Hum. Gene Ther.* (1997) 8:511-512.

Ferguson; B.Q. and Yang, D.C.H. Localization of Noncovalently Bound Ethidium in Free and Methionyl-tRNA Synthetase Bound tRNA$^{fMet}$ by Singlet-Singlet Energy Transfer; *Biochemistry* (1986) 25:5298-5304.

Fernandez-Saiz. M. et al. A Cationic Cydophane That Forms a Base-Pair Open Complex with RNA Duplexes; *J. Am. Chem. Soc.* (1996) 118:4739-4745.

Frankel, A.D. Peptide models of the Tat-TAR protein-RNA interaction; *Prot. Sci.* (1992) 1:1539-1542.

Futami, J. et al. Optimum Modification for the Highest Cytotoxicity of Cationized Ribonuclease; *J. Biochem.* (2002) 132:223-228.

Gallego, J. and Varani, G. Targeting RNA with Small-Molecule Drugs: Therapeutic Promise and Chemical Challenges; *Acc. Chem. Res.* (2001) 34:10:836-843.

Gallo, R and Montagnier, L. AIDS in 1988; *Sci. Am.* (1988) 259:4:41-48.

Ganachaud, F. et al. Adsorption of Single-Stranded DNA Fragments onto Cationic Aminated Latex Particles; *Langmuir* (1997) 13:701-707.

Gaylord, B. S. et al. DNA detection using water-soluble conjugated polymers and peptide nucleic acid probes; *Proc. Natl. Acad. Sci. USA* (2002) 99:17:10954-10957.

Gaylord, B.S. et al. Water-Soluble Conjugated Oligomers: Effect of Chain Length and Aggregation on Photoluminescence-Quenching Efficiencies; *J. Am. Chem. Soc.* (2001) 123:6417-6418.

Gaylord, B.S. et al. DNA Hybridization Detection with Water-Soluble Conjugated Polymers and Chromophore-Labeled Single-Stranded DNA; *J. Am. Chem. Soc.* (2003) 125:896-900.

Gershon, H. et al. Mode of Formation and Structural Features of DNA-Cationic Liposome Complexes Used for Transfection; *Biochemistry* (1993) 32:7143-7151.

Giesen, U. et al. A formula for thermal stability ($T$m) prediction of PNA/DNA duplexes; *Nucleic Acids Res.* (1998) 26:21:5004-5006.

Gössl, L. et al. Molecular Structure of Single DNA Complexes with Positively Charged Dendronized Polymers; *J. Am. Chem. Soc.* (2002) 124:6860-6865.

Hage, D.S.. Immunoassays; *Anal. Chem.* (1999) 71:1294R-304R.

Hanvey, J.C. et al. Antisense and Antigen Properties of Peptide Nucleic Acids; *Science* (1992) 258:1481-1485.

Harada, A. and Kataoka, K. Chain Length Recognition: Core-Shell Supramolecular Assembly from Oppositely Charged Block Copolymers; *Science* (1999) 283:65-67.

Ho, H.A. et at. Colorimetric and Fluorometric Detection of Nucleic Acids Using Cationic Polythiophene Deriaties; *Angew. Chem. Int. Ed.* (2002) 41:9:1548-1551.

Izumrudov, V.A. et al. The influence of chain length of a competitive polyanion and nature of monovalent counterions on the direction of the substitution reaction of polyelectrolyte complexes; *Makromol. Chem., Rapid Commun.* (1988) 9:7-12.

Izumrudov, V.A. et al. Competitive Reactions in Solutions of DNA and Water-Soluble Interpolyelectrolyte Complexes; *Biopolymers* (1995) 35:523-531.

Izumrudov, V.A. et al. Competitive Displacement of Ethidium Cations Intercalated in DNA by Polycations; *Dokl. Phys. Chem.* (1995) 342:Nos. 4-6: 150-153.

Izumrudov, V.A. et al. Ethidium Bromide as a Promising Probe for Studying DNA Interaction with Cationic Amphiphiles and Stability of the Resulting Complexes: *Langmuir* (2002) 18:10348-10356.

Izumrudov, V.A. et al. Controllable Stability of DNA-Containing Polyelectrolyte Complexes in Water-Salt Solutions; *Biopolymers.* (1999) 52:94-108.

Izumrudov, V.A. and Zhiryakova, M.V. Stability of DNA-containing interpolyelectrolyte complexes in water-salt solutions; *Macromol. Chem. Phys.* (1999) 200:11:2533-2540.

Jain, C. and Belasco, J.G. Rapid Genetic Analysis of RNA-Protein Interactions by Translational Repression in *Escherichia coli*; *Methods Enzymol.* (2000) 318:309-332.

Jenkins, Y. and Barton, J.K. A Sequence-Specific Molecular Light Switch: Tethering of an Oligonucleotide to a Dipyridophenazine Complex of Ruthenium (II); *J. Am. Chem. Soc.* (1992) 114:8736-8738.

Johansson, M.K. et al. Intramolecular Dimers: A New Strategy to Fluorescence Quenching in Dual-Labeled Oligonudeotide Probes; *J. Am. Chem. Soc.* (2002) 124:6950-6956.

Kabanov, A.V. et al. DNA Interpolyelectrolyte Complexes as a Tool for Efficient Cell Transformation; *Biopolymers.* (1991) 31:1437-1443.

Kabanov, A.V. and Kabanov, V.A. DNA Complexes with Polycations for the Delivery of Genetic Material into Cells; *Bioconjugate Chem.* (1995) 6:7-20.

Kabanov, V.A. et al. Cooperative Interpolyelectrolyte Reactions; *Makromol. Chem. Suppl.* (1985) 13:137-155.

Karn, J. et al. HIV A Practical Approach; RNA binding assays for the regulatory proteins Tat and Rev; *IRL Press*, New York; (1995) 9:147-165.

Katayose, S. and Kataoka, K. Water-Soluble Polyion Complex Associates of DNA and Poly(ethylene glycol)-Poly($_L$-lysine) Block Copolymer; *Bioconjugate Chem.* (1997) 8:702-707.

Kircheis, R. et al. Tumor targeting with surface-shielded ligand-polycation DNA complexes; *J. Controlled Release;* (2001) 72:165-170.

Kirsh, Yu. E. et al. Comparison of Properties of an Oxime-Bound Partially Quatemized Poly-4-Vinylpyridine and a Monomer Analogous Oxime; *Eur. Polym. J.* (1974) 10:393-399.

Knemeyer. J. et al. Probes for Detection of Specific DNA . . . *Anal. Chem.* (2000) 72:3717-3724.

Kwon, I.C. et al. Electrically Erodible polymer gel for controlled release of drugs; *Nature* (1991) 354:291-293.

Leclerc M. Optical and Electrochemical Transducers Based on Functionalized Conjugated Polymers; *Adv. Mater,* (1999) 11:18:1491-1498.

Lee, M.A. et al. ResonSense®: simple linear fluorescent probes for quantitative homogeneous rapid polymerase chain reaction; *Anal. Chim. Acta* (2002) 457:61-70.

Le-Pecq, J.B. and Paoletti, C. A Fluorescent Complex between Ethidium Bromide and Nucleic Adds; *J. Mol Biol.* (1967) 27:87-106.

(56) References Cited

OTHER PUBLICATIONS

Leulliot, N. and Varani, G. Current Topics in RNA-Protein Recognition: Control of Specificity and Biological Function through Induced Fit and Conformational Capture; *Biochemistry* (2001) 40:27:7947-7956.

Liu, B. et al. Effect of Chromophore-Charge Distance on the Energy Transfer Properties of Water-Soluble Conjugated Oligomers; *J. Am. Chem. Soc.* (2003) 125:6705-6714.

Makino, S. et al. Molecular Characterization and Protein Analysis of the *cap* Region, Which is Essential for Encapsulation in *Bacillus anthracis*; *J. Bacteriol.* (1989) 171:2:722-730.

Manning, G.S. Thermodynamic Stability Theory for DNA Doughnut Shapes Induced by Charge Neutralization; *Biopolymers.* (1980) 19:37-59.

Manning, G.S. The Possibility of Intrinsic Local Curvature in DNA Toroids; *Biopolymers.* (1981) 20:1261-1270.

Manning, G.S. The molecular theory of polyelectrolyte solutions with applications to the electrostatic properties of polynucleotides; *Qrtly Review of Biophysics.* (1978) v.11: 179-246.

Maruyama, A. et al. Characterization of Interpolyelectrolyte Complexes between Double-Stranded DNA and Polylysine Comb-Type Copolymers Having Hydrophilic Side Chains; *Bioconjugate Chem.* (1998) 9:292-299.

Matsumoto, C; et al. High-Throughput Screening Utilizing Intramolecular Fluorescence Resonance Energy Transfer for the Discovery of the Molecules that Bind HIV-1 TAR RNA Specifically; *Bioorg. Med. Chem. Lett.* (2000) 10:1857-1861.

McLoughlin, D.M. et al. A simple and effective separation and purification procedure for DNA fragments using Dodecyltrimethylammonium bromide; *Bioseparation.* (2001) 9:307-313.

McQuade, D.T. et al. Conjugated Polymer-Based Chemical Sensors; *Chem. Rev.* (2000) 100:2537-2574.

McQuade, D.T. et al. Signal amplification of a "Turn-On" Sensor: Harvesting the Light Captured by a Conjugated Polymer; *J. Am. Chem. Soc.* (2000) 122:12389-12390.

Mel'Nikov, S.M. et al. Discrete Coil—Globule Transition of Large DNA Induced by Cationic Surfactant; *J. Am. Chem. Soc.* (1995) 117:2401-2408.

Mergny, J.L. et al. Fluorescence Energy Transfer between Two Triple Helix-Forming Oligonucleotides Bound to Duplex DNA; *Biochemistry.* (1994) 33:15321-15328.

Miao, Y.J. et al. Photophysics of Poly(paracyclophan-1-ene) and Derivatives: Evidence for Intrachain Energy Transfer and Chromophore Aggregation; *J. Am. Chem. Soc.* (1995) 117:11407-11420.

Miller, I.R. and Bach, D. Interaction of DNA with Heavy Metal Ions and Polybases: Cooperative Phenomena; *Biopolymers.* (1968) 6:169-179.

Minehan, D.S. et al. Kinetics of DNA Binding to Electrically Conducting Polypyrrole Films; *Macromolecules.* (1994) 27:777-783.

Morgan, A.R. and Pulleyblank, D.E. Native and Denatured DNA, Cross-Linked and Palindromic DNA and Circular Covalently-Closed DNA Analysed by a Sensitive Fluorometric Procedure; *Biochem. Biophys. Res. Commun.* (1974) 61:2:396-403.

Nielsen, P.E. Applications of peptide nucleic acids, *Analytical biotechnology.* (1999) 10:71-75.

Nguyen, H-K, et al. Nonviral Transfer Technology: Evaluation of polyether-polyethyleneimine graft copolymers as gene transfer agents; *Gene Ther.* (2000) 7:126-138.

Nishanian, P. et al. A Simple Method for Improved Assay Demonstrates that HIV p24 Antigen is Present as Immune Complexes in Most Sera from HIV-Infected Individuals; *J. Infect. Dis.* (1990) 162:21-28.

Nuovo, G.J. In Situ Localization of PCR-Amplified DNA and cDNA; *Methods Mol. Bio.* (2000) 123:217-238.

Olins, D.E. et al. Model Nucleoprotein Complexes: Studies on the Interaction of Cationic Homopolypeptides with DNA; *J. Mol. Biol.* (1967) 24:157-176.

Pasternack, R.F. et al. Long-Range Fluorescence Quenching of Ethidium Ion by Cationic Porphyrins in the Presence of DNA; *J. Am. Chem. Soc.* (1991) 113:6835-6840.

Patolsky, F. et al. Amplified DNA Detection by Electrogenerated Biochemiluminescence and by the Catalyzed Precipitation of an Insoluble Product on Electrodes in the Presence of the Doxorubicin Intercalator; *Angew. Chem. Int. Ed.* (2002) 41:18:3398-3402.

Patolsky, F. et al. Electronic Transduction of DNA Sensing Processes on Surfaces: Amplification of DNA Detection and Analysis of Single-Base Mismatches by Tagged Liposomes; *J. Am Chem. Soc.* (2001) 123:5194-5205.

Peterlinz, K.P. et al. Observation of Hybridization and Dehybridization of Thiol-Tethered DNA using Two-Color Surface Plasmon Resonance Spectroscopy; *J. Am. Chem. Soc.* (1997) 119:3401-3402.

Petty, J.T. et al. Thermodynamic Characterization of the Association of Cyanine Dyes with DNA; *J. Phys. Chem. B.* (2000) 104:7221-7227.

Pilipenko, E.V. et al. A cell cycle-dependent protein serves as a template-specific translation initiation factor; *Genes & Dev.* (2000) 14:2028-2045.

Pinto, M.R. and Schanze, K.S. Conjugated Polyelectrolytes: Synthesis and Applications; *Synthesis.* (2002) 9:1293-1309.

Plank, C. et al. Branched Cationic Peptides for Gene Delivery: Role of Type and Number of Cationic Residues in Formation and in Vitro Activity of DNA Polyplexes; *Hum. Gene Ther.* (1999) 10:319-332.

Portela, A. and Digard, P. The influenza virus nucleoprotein: a multifunctional RNA-binding protein pivotal to virus replication; *J. Gen. Virol.* (2002) 83:723-734.

Puglisi, J.D. et al. Conformation of the TAR RNA-Arginine Complex by NMR Spectroscopy; *Science.* (1992) 257:76-80.

Pullman, B. et al. Two Aspects of DNA Polymorphism and Microheterogeneity: Molecular Electrostatic Potential and Steric Accesibility; *J. Biochem.* (1982) 124:229-238.

Richter, S. et al. Specific HIV-1 TAR RNA Loop Sequence and Functional Groups are Required for Human Cyclin T1-Tat-TAR Ternary Complex Formation; *Biochemistry.* (2002) 41:6391-6397.

Saghatelian, A. et al. DNA Detection and Signal Amplification via an Engineered Allosteric Enzyme; *J. Am. Chem. Soc.* (2003) 125:344-345.

Saiki, R.K et al. Enzymatic Amplification of β-Globin Genomic Sequences and Restriction Site Analysis for Diagnosis of Sickle Cell Enemia; *Science.* (1985) 230:1350-1354.

Schork, N.J. et al. Single nucleotide polymorphisms and the future of genetic epidemiology; *Clin. Genet.* (2000) 58:250-264.

Seymour, L.W. et al. Cationic block copolymers as self-assembling vectors for gene delivery; *Self-assembling Complexes for Gene Delivery;* (1998) 11:219-239.

Shinozuka, K. et al. A Novel Multifunctionalily Labelled DNA Probe Bearing an Intercalator and a Fluorophore; *J. Chem. Soc., Chem. Commun.* (1994) 1377-1378.

De Smedt, S.C. et al. Cationic Polymer Based Gene Delivery Systems; *Pharm. Res.* (2000) 17:2:113-126.

Smith, J.O. et al. Molecular Recognition of PNA-Containing Hybrids: Spontaneous Assembly of Helical Cyanine Dye Aggregates on PNA Templates; *J. Am. Chem. Soc.* (1999) 121:2686-2695.

Smith, P. et al. Surfactant structure around DNA in aqueous solution; *Phys. Chem. Chem. Phys.* (2000) 2:1305-1310.

Stender, H. et al. PNA for rapid microbiology; *J. Microbiological Methods.* (2002) 48:1-17.

Stork, M. et al. Energy Transfer in Mixtures of Water-Soluble Oligomers: Effect of Charge, Aggregation, and Surfactant Complexation; *Adv. Mater.* (2002) 14:5:361-366.

Su, X et al. Au nanoparticle- and silver-enhancement reaction-amplified microgravimetric biosensor; *Chem. Commun.* (2001) 755-756.

Sullenger, B.A. and Gilboa, E. Emerging clinical applications of RNA; *Nature.* (2002) 418:252-258.

Takakusa, H. et al. Design and Synthesis of an Enzyme-Cleavable Sensor Molecule for Phosphodiesterase Activity Based on Fluorescence Resonance Energy Transfer; *J. Am. Chem. Soc.* (2002) 124:8:1653-1657.

(56) References Cited

OTHER PUBLICATIONS

Tamilarasu, N. et al. A New Strategy for Site-Specific Protein Modification: Analysis of a Tat Peptide-TAR RNA Interaction; *Bioconjugate Chem.* (2001) 12:2:135-138.
Tang, M.X. and Szoka, F.C. The influence of polymer structure on the interactions of cationic polymers with DNA and morphology of the resulting complexes; *Gene Ther.* (1997) 4:823-832.
Demers, L.M. et al. Thermal Desorption; J.Am.Chem. Soc(2002) 124, 11248-11249.
Taton, T.A. et al. Scanometric DNA Array Detection with Nanoparticle Probes; *Science.* (2000) 289:1757-1760.
Taton, T.A. et al. Two-Color Labeling of Oligonucleotide Arrays via Size-Selective Scattering of Nanoparticle Probes; *J. Am. Chem. Soc.* (2001) 123:5164-5165.
Tomac, S. et al. Ionic Effects on the Stability and Conformation of Peptide Nucleic Acid Complexes; *J. Am. Chem. Soc.* (1996) 118:5544-5552.
Traser, S. et al. Syntheses and solution properties of water-soluble poly(p-phenylene)s bearing oligo(ethylene oxide) and trialkylamino side groups; *e-Polymers.* (2002) 32:1-39.
Umek, R.M. et al. Electronic Detection of Nucleic Acids—A Versatile Platform for Molecular Diagnostics; *J. Mol. Diag.* (2001) 3:2:74-84.
Vaishnav, Y.N. and Wong-Staal, F. The Biochemistry of Aids; *Ann. Rev. Biochem.* (1991) 60:577-630.
Varani, G. RNA-Protein Intermolecular Recognition; *Acc. Chem. Res.* (1997) 30:5:189-195.
Vinogradov, S.V. et al. Self-Assembly of Polyamine-Poly(ethylene glycol) Copolymers with Phosphorothioate Oligonucleotides; *Bioconjugate Chem.* (1998) 9:805-812.
Wang, J. et al. Photoluminescence of Water-Soluble Conjugated Polymers: Origin of Enhanced Quenching by Charge Transfer; *Macromolecules.* (2000) 33:5153-5158.
Wang, J. et al. DNA Electrochemical Biosensor for the Detection of Short DNA Sequences Related to the Human Immunodeficiency Virus; *Anal. Chem.* (1996) 68:15:2629-2634.
Isola, N.R. et al. Surface-Enhanced Raman Gene Probe for HIV Detection; *Anal. Chem.* (1998) 70:1352-1356.
Wang, J. Survey and Summary From DNA biosensors to gene chips; *Nucleic Acid Res.* (2000) 28:16:3011-3016.
Wang, J. et al. Dendritic Nucleic Acid Probes for DNA Biosensors; *J. Am. Chem. Soc.* (1998) 120:8281-8282.
Wang, J. et al. Synthesis of AB(BA), ABA and BAB Block Copolymers of *tert*-Butyl Methacrylate (A) and Ethylene Oxide (B); *J. Polym. Sci., Part A: Polym. Chem.* (1992) 30:2251-2261.
Wang, Y. et al. Interaction of DNA with Cationic Micelles: Effects of Micelle Surface Charge Density, Micelle Shape, and Ionic Strength on Complexation and DNA Collapse; *Langmuir.* (2001) 17:1670-1673.
Waring, M. J. Complex Formation between Ethidium Bromide and Nucleic Acids; *J. Mol. Biol.* (1965) 13:269-282.
Weeks, K.M. et al. Fragments of the HIV-1 Tat Protein Specifically Bind TAR RNA; *Science.* (1990) 249:1281-1285.
Whitcombe, D. et al. Detection of PCR products using self-probing amplicons and fluorescence; *Nat. Biotechnol.* (1999) 17:804-807.
Wolfert, M.A. et al. Polyelectrolyte Vectors for Gene Delivery: Influence of Cationic Polymer on Biophysical Properties of Complexes Formed with DNA; *Bioconjugate Chem.* (1999) 10:993-1004.
Wyman, T.B. et al. Design, Synthesis, and Characterization of a Cationic Peptide that Binds to Nucleic Acids and Permeabilizes Bilayers; *Biochemistry.* (1997) 36:3008-3017.
Xu, X.H. and Bard, A.J. Immobilization and Hybridization of DNA on an Aluminum(III) Alkanebisphosphonate Thin Film with Electrogenerated Chemiluminescent Detection; *J. Am. Chem. Soc.* (1995) 117:2627-2631.
Yang, J.S. and Swager, T.M. Fluorescent Porous Polymer Films as TNT Chemosensors: Electronic and Structural Effects; *J. Am. Chem. Soc.* (1998) 120:11864-11873.
Junhui, Z. et al. DNA Based Biosensors; *Biotechnol. Adv.* (1997) 15:43-58.

Jian Wang, et al. "Photoluminescence of water-soluble conjugated polymers: origin of enhanced quenching by charge transfer" *Macromolecules.* vol. 33, (2000), pp. 5153-5158.
Bin Liu, et al. "Effect of chromophore-charge distance on the energy transfer properties of water-soluble conjugated oligomers" *Journal of the American Chemical Society*, vol. 125, (203) pp. 6706-5-6714.
Bin Liu, et al. "Shape-adaptable water-soluble conjugated polymers" *Journal of the American Chemical Society.* vol. 125, (203) pp. 13306-13307.
Shu Wang, Guillermo Bazan, "Solvent-dependent aggregation of a water-soluble poly(fluorine) controls energy transfer to chromophore-labeled DNA" *Chem. Commun.* (2004) pp. 2508-2509.
Bin Liu, et al. "Synthesis of novel cationic water-soluble efficient blue photoluminescent conjugated polymer" *Chem. Commun.* (2000), pp. 551-552.
Bin Liu, et al. "Blue-light-emitting cationic water-soluble polyfluorene derivatives with tunable quaternization degree" *Macromolecules.* vol. 35 (2002), pp. 4975-4982.
Martin Stork, et al. "Energy transfer ix mixtures of water-soluble oligomers: effect of charge, aggregation and surfactant complexation" *Advanced Materials* vol. 14, No. 5 (2002) pp. 361-366.
Fei Huang, et al. "Novel electroluminescent conjugated polyelectrolytes based on polyfluorene" *Chem. Mater.*, vol. 16 (2004) pp. 708-716.
Wang et al., "Size-Specific Interactions Between Single- and Double-Stranded Oligonucleotides and Cationic Water-Soluble Oligofluorenes", Adv. Funct. Mater., Jun. 2003, 13(6), 463-467.
Stork et al., "Energy Transfer in Mixtures of Water-Soluble Oligomers: Effect of Charge, Aggregation, and Surfactant Complexation", Adv. Mater., Mar. 2002, 14(5), 361-366.
Leclerc, "Optical and Electrochemical Transducers Based on Functionalized Conjugated Polymers", Adv. Mater., 1999, 11(18), 1491-1498.
Balakin et al., "Conjugates of oligonucleotides with polyaromatic fluorophores as promising DNA probes", Biosensors & Bioelectronics, 1998, 13, 771-778.
Ho et al., "Colorimetric and Fluormetric Detection of Nucleic Acids Using Cationic Polythiophene Derivatives", Angew. Chem. Int. Ed., 2002, 41(9), 1548-1551.
McQuade et al., "Conjugated Polymer-Based Chemical Sensors", Chem. Rev., 2000, 100, 2537-2574.
Chen et al., "Highly sensitive biological and chemical sensors based on reversible fluorescence quenching in a conjugated polymer", PNAS, Oct. 1999, 96(22), 12287-12292.
Liu et al., "Effect of Chromophore-Charge Distance in the Energy Transfer Properties of Water-Soluble Conjugated Oligomers", J. Am. Chem. Soc., 2003, 125, 6705-6714.
Gaylord et al., "DNA detection using water-soluble conjugated polymers and peptide nucleic acid probes", PNAS, Aug. 2002, 99(17), 10954-10957.
Bronich et al., "Recognition of DNA Topology in Reactions between Plasmid DNA and Cationic Copolymers", J. Am. Chem. Soc., Sep. 2000, 122(35), 8339-8343.
Chen et al., "Tuning the Properties of Conjugated Polyelectrolytes through Surfactant Complexation", J. Am. Chem. Soc., 2000, 122, 9302-9303.
Gaylord et al., "Water-Soluble Conjugated Oligomers: Effect of Chain Length and Aggregation on Photoluminescene-Quenching Efficiencies", J. Am. Chem. Soc., 2001, 123, 6417-6418.
Hong et al., "Water-Soluble Oligmer Dimers Based on Paracyclophane: A New optical Platform for Fluorescent Sensor Applications", J. Am. Chem. Soc., 2002, 124, 11868-11869.
Gaylord et al., "DNA Hybridization Detection with Water-Soluble Conjugated Polymers and Chromophore-Labeled Single-Stranded DNA", J. Am. Chem. Soc., 2003, 125, 896-900.
Zhou et al., "Fluorescent Chemosensors Based on Energy Migration in Conjugated Polymers: The Molecular Wire Approach to Increased Sensitivity", J. Am. Chem. Soc., 1995, 117, 12593-12602.
Zhou et al., "Methodology for Enhancing the Sensitivity of Fluorescent Chemosensors: Energy Migration in Conjugated Polymers", J. Am. Chem. Soc., 1995, 117, 7017-7018.

(56) References Cited

OTHER PUBLICATIONS

Hawkins et al., "Incorporation of a fluorescent guanosine analog into oligonucleotides and its application to a real time assay for the HIV-1 integrase 3'-processing reaction", Nucleic Acids Research, 1995, 23(15), 2872-2880.

Cardullo et al., "Detection of Nucleic Acid Hybridization by Nonradiative Fluorescence Resonance Energy Transfer", Proc. Natl. Acad. Sci. USA, Dec. 1998, 85, 8790-8794.

Gallot et al., "Poly(L-lysine) containing azobenzene units in the side chains: influence of the degree of substitution on liquid crystalline structure and thermotropic behaviour", Liquid Crystals, 1997, 23(1), 137-146.

Wang et al., "Biosnesors from conjugated polyelectrolyte complexes", PNAS, Jan. 2002, 99(1), 49-53.

Liu et al., "Methods for strand-specific DNA detection with cationic conjugation polymers suitable for incorporation into DNA chips and microarrays", PNAS Early Edition, Dec. 2004, p. 1-5.

Vehse et al., "Light Amplification by Optical Excitation of a Chemical Defect in a Conjugated Polymer", Adv. Mater., Jun. 2004, 16(12), 1001-1004.

Liu et al., "Shape-Adapable Water-Soluble Conjugated Polymers", J. Am. Cham. Soc., 2003, 125, 13306-13307.

Liu et al., "Interpolyelectrolyte Complexes of Conjugated Copolymers and DNA: Platforms for Multicolor Biosensors", J. Am. Chem. Soc., 2004, 126, 1942-1943.

Huang et al., "High-Efficiency, Evironment-Friendly Electroluminescent Polymers with Stable High Work Function Metal as a Cathode: Green- and Yellow-Emitting Conjugated Polyfluorene Polyelectrolytes and Their Neutral Precursors", J. Am. Chem. Soc., 2004, 126, 9845-9853.

Service, "DNA Analysis: Microchip Arrays Put DNA on the Spot", The American Association for the Advancement of Science, Oct. 1998, 282(5388), 396-399.

Southern, "DNA chips: analysing sequence by hybridization to oligonucleotides on a large scale", TIG, Mar. 1996, 12(3), 110-115.

Epstein et al., "Microarray technology—enhanced versatility, persistent challenge", Current Opinion in Biotechnology, 2000, 11, 36-41.

Heeger et al., "Making Sense of polymer-based biosensors", PNAS, Oct. 1999, 96(22), 12219-12221.

Patel et al., "Energy transfer analysis of Fos-Jun dimerization and DNA binding", Proc. Natl. Sci. USA, Jul. 2994, 91, 7360-7364.

Lohse et al., "Fluorescein-Conjugated Lysine Monomers for Solid Phase Synthesis of Fluorescents Peptides and PNA Oligomers", Bioconjugate Chem., 1997, 8, 503-509.

Smith et al., "The synthesis of oligonucleotides containing an aliphatic amino group at the 5' terminus: synthesis of fluorescent DNA primers for use in DNA sequence analysis", Nucleic Acids Research, 1985, 13(7) 2399-2412.

Wintermeyer et al., "Fluorescent Derivatives of Yeast tRNA(TM)", Eur. J. Biochem., 1979, 98, 465-475.

Lipshutz et al., "High density synthetic oligonucleotide arrays", Nature Genetics Supplement, Jan. 1999, 21, 20-24.

Nilsson et al., "Chip solution detection of DNA hybridization using a luminescent zwitterionic polythiophene derivative", Nature Materials, Jun. 2003, 2, 419-424 (Supplementary Information pp. 1-2).

Dore et al., "Fluorescent Polymeric Transducer for the Rapid, Simple, and Specific Detection of Nucleic Acids at the Zeptomole Level", J. Am. Chem. Soc., 2004, 126, 4240-4244.

Ranade et al., "High-Throughput Genotyping with Single Nucleotide Polymorphisms", Genone Research, 2001, 11, 1262-1268.

Schork et al., "Single nucleotide polymorphisms and the furture if genetic epidemiology", Clin. Genet., 2000, 58, 250-264.

Wang et al., "Optically Amplified RNA-Protein Detection Methods Using Light-Harvesting Conjugated Polymers", Adv. Mater., Sep. 2003, 15(17), 1425-1428.

Liu et al., "Homogeneuos Fluorescents-Based DNA Detection with Water-Soluble Conjugated Polymers", Chem. Mater., 2004, 16, 4467-4476.

Wolcott, "Advances in Nucleic Acid-Based Detection Methods", Clinical Microbiology Reviews, Oct. 1992, 5(4), 370-386.

Umek et al., "Electronic Detection of Nucleic Acids, A Versatile Platform for Molecular Diagnostics", Journal of Molecular Diagnostics, May 2001, 3(2), 74-84.

Stevens et al., "Exciton dissociation mechanisms in the polymeric semiconductors poly(9,9-dioctylfluorene) and poly(9,9-dioctylfluorene-co-benzothiadiazole)", Physical Review B, Apr. 2001, 63, 1-18.

Wang, "Survey and Summary From DNA biosensors to gene chips", Nucleic Acids Research, 2000, 28(16), 3011-3016.

Beier et al., "Versatile derivatisation of solid support media for covalent bonding on DNA-microchips", Nucleic Acids Research, 1999, 27(9), 1970-1977.

Hongbin Wu et al. "Efficient electron injection from a bilayer cathode . . . " Adv. Mater. 2004, 16, No. 20, Oct. 18, p. 1826-1830.

Fei Huang et al. "High efficiency, environment-friendly electroluminescent . . . " J. Am. Chem. Soc. 2004, 126, pp. 9845-9853.

Hongbin Wu et al. "High-efficiency electron injection . . . " Organic Electronics 6 (2005), pp. 118-128.

Yong Cao et al. "Efficient electron injection . . . " Society for Informational Display International Symposium 2004, 35, Digest pp. 892-895.

U.S. Appl. No. 60/202,647, filed May 8, 2000, Whitten.
U.S. Appl. No. 60/226,902, filed Aug. 23, 2000, Whitten.
U.S. Appl. No. 60/230,186, filed Sep. 1, 2000, Phillips.
U.S. Appl. No. 60/237,000, filed Sep. 29, 2000, Bruchez.
U.S. Appl. No. 60/240,216, filed Oct. 13, 2000, Bruchez.
U.S. Appl. No. 60/276,090, filed Mar. 16, 2001, Jones.
U.S. Appl. No. 60/314,094, filed Aug. 23, 2001, Burdick.
U.S. Appl. No. 60/314,101, filed Aug. 23, 2001, Whitten.
U.S. Appl. No. 10/167,043, filed Sep. 4, 2003, Qingya Zhou et al.
U.S. Appl. No. 09/929,191, filed Feb. 21, 2002, Vinod P. Menon et al.
U.S. Appl. No. 09/044,742, filed Jul. 4, 2000, Friedrich Jonas et al.

Cao et al., Polymer light-emitting diodes with polyethylene dioxythiophene-polystyrene sulfonate as the transparent anode (1997), Synthetic Metals 87, 171-174.

Translation of office action from a related Japanese application 2007-530486, relevant to submitted Foreign Patent Document JP 2003-347061.

Translation of office action from a related Japanese application 2006-527071, relevant to submitted Foreign Patent Documents JP 2003-257647 and JP 2003-251832.

German Office Action (with English translation) dated Feb. 15, 2013 for German Patent Application No. 11 2004 001 737.8.

\* cited by examiner (a) without ETL (b) with ETL

METHODS AND DEVICES COMPRISING SOLUBLE CONJUGATED POLYMERS

STATEMENT REGARDING FEDERALLY SPONSORED RESEARCH

Work leading to this invention was performed under support from the Air Force Office of Scientific Research and under support from the University of California under the UC SMART Program. The U.S. Government may have limited rights in this invention.

TECHNICAL FIELD

This invention relates to soluble conjugated polymers.

BACKGROUND OF THE INVENTION

Polymeric semiconductors have been incorporated into a wide array of electronic, optical and optoelectronic materials and devices. One limitation on manufacturing processes involving semiconducting polymers is the difficulties in preparing multilayer materials. Solution processing is one of the simplest, most economical, and most controllable methods for depositing layers of a conjugated polymer of interest. However, because most conjugated polymers are soluble in organic and/or nonpolar media, depositing a solution of one conjugated polymer onto a previously deposited layer of another conjugated polymer can solubilize it and result in interfacial mixing. This can lead to disruption of the desired device orientation/structure/geometry, process irreproducibility, and reduced efficiency of resulting devices. Thus traditional manufacturing methods for multilayer devices typically involve only one solution processing step for depositing polymers, with remaining layers deposited by more problematic methods, including sputtering, thermal vapor deposition, and chemical deposition methods, which can be more costly and less controllable.

There is a need in the art for conjugated polymers having different physical properties, for methods of making and using them, and for compositions, articles of manufacture and machines comprising such compounds.

SUMMARY OF THE INVENTION

Methods, compositions and articles of manufacture involving soluble conjugated polymers are provided. The conjugated polymers have a sufficient density of polar substituents to render them soluble in a polar medium, for example water and/or methanol. The conjugated polymer may desirably comprise monomers which alter its conductivity properties. In some embodiments, the inventors have provided cationic conjugated polymers (CCPs) comprising both solubilizing groups and conductive groups, resulting in conductive conjugated polymers soluble in polar media. The different solubility properties of these polymers allow their deposition in solution in multilayer formats with other conjugated polymers. Also provided are articles of manufacture comprising multiple layers of conjugated polymers having differing solubility characteristics. Embodiments of the invention are described further herein.

DETAILED DESCRIPTION OF THE INVENTION

Figure 1:
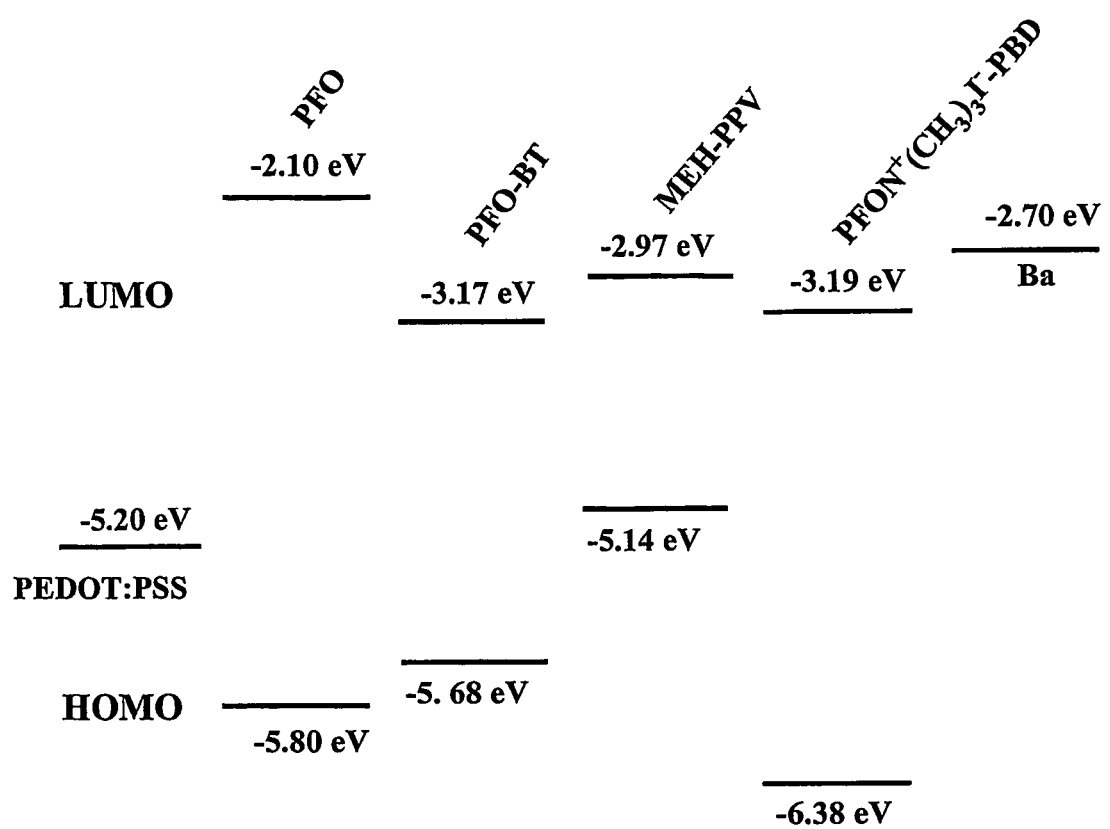
FIG. 1 depicts the HOMO (highest occupied molecular orbital) and LUMO (lowest unoccupied molecular orbital) energy levels of poly(9,9-dioctylfluorenyl-2,7-diyl) ("PFO"), poly(9,9-dihexyl-fluorene-co-benzothiadiazole) ("PFO-BT"), poly[2-methoxy-5-(2-ethyl-hexyloxy)-1,4-phenylene vinylene] ("MEH-PPV") and poly{[9,9-bis(6'-(N,N,N-trimethylammonium)hexyl)fluorine-2,7-diyl]-alt-[2,5-bis(p-phenylene)-1,3,4-oxadiazole]}("PFON$^+$(CH3)$_3$I$^-$-PBD") compared to the work function of Ba (all referenced with respect to the vacuum).

The inventors have provided conjugated polymers having desirable properties. The conjugated polymers have a sufficient density of polar substituents to render them soluble in a polar medium. The polymers thus have desirable solubility properties allowing for their use with polymers of differing solubilities in methods involving multiple solution processing steps. The different solubility properties of these polymers allow their deposition in solution in multilayer formats with other conjugated polymers.

In some embodiments, the polar substituents can be charged groups, for example cationic or anionic groups. The conjugated polymers may have a sufficient density of solubilizing polar groups to render them soluble in a highly polar solvent such as water and/or methanol. This can be particularly advantageous for preparing multilayer polymeric devices via novel solution processing methods, also provided.

The conjugated polymer may desirably comprise monomers which alter its conductivity properties. The conjugated polymer can comprise monomers which improve its ability to inject and/or transport electrons. The conjugated polymer can comprise monomers which improve its ability to inject and/or transport holes. The conductivity of such polymers can be controlled through the type and/or amount of monomer(s) used, which may be selected to match with other materials of interest in electronic devices. The composition of the polymer may also be chosen to prevent conductivity of certain species. For example, the composition of the polymer may be chosen so that it has hole-blocking properties, which can be desirable in certain device configurations, for example in polymer light-emitting diodes (PLEDs).

In some embodiments, the inventors have provided cationic conjugated polymers (CCPs) comprising both solubilizing groups and conductive groups, resulting in conductive conjugated polymers soluble in polar media. These conductive polymers are desirably soluble in water and/or lower alcohols, particularly methanol.

In some embodiments the CCPs can comprising monomers which perturb the polymer's ability to form rigid-rod structures, allowing them to form a greater range of three-dimensional structures. The monomers are aromatic molecules having attachment points to the adjacent subunits of the polymer which form an angle of greater than about 25° from linear. The monomers may introduce a torsional twist in the conjugated polymer, thereby further disrupting the ability of the polymer to form a rigid-rod structure.

Also provided are articles of manufacture comprising multiple layers of conjugated polymers having differing solubility characteristics. Multiple polymer layers produced by methods described herein can be incorporated in any of a variety of articles and machines.

Embodiments of the invention can comprise multiplex formats. For example, a plurality of different LEDs can be used simultaneously in a display format. Multiplex embodiments may employ 2, 3, 4, 5, 10, 15, 20, 25, 50, 100, 200, 400, 1000, 5000, 10000, 50000, 200000, one million or more distinct articles provided by one or more embodiments described herein. Other aspects of the invention are discussed further herein.

Before the present invention is described in further detail, it is to be understood that this invention is not limited to the particular methodology, articles, compositions or apparatuses described, as such methods, articles, compositions or apparatuses can, of course, vary. It is also to be understood that the terminology used herein is for the purpose of describing particular embodiments only, and is not intended to limit the scope of the present invention.

Use of the singular forms "a," "an," and "the" include plural references unless the context clearly dictates otherwise. Thus, for example, reference to "a conjugated polymer" includes a plurality of conjugated polymers, reference to "a solvent" includes a plurality of such solvents, reference to "an LED" includes a plurality of LEDs, and the like. Additionally, use of specific plural references, such as "two," "three," etc., read on larger numbers of the same subject unless the context clearly dictates otherwise. The term "or" when used herein as the sole conjunction means "and/or" unless stated otherwise. The term "including" and related terms such as "includes" as used herein are not limiting and allow for the presence of elements in addition to those specifically recited.

Terms such as "connected," "attached," and "linked" are used interchangeably herein and encompass direct as well as indirect connection, attachment, linkage or conjugation unless the context clearly dictates otherwise.

Where a range of values is recited, it is to be understood that each intervening integer value, and each fraction thereof, between the recited upper and lower limits of that range is also specifically disclosed, along with each subrange between such values. The upper and lower limits of any range can independently be included in or excluded from the range, and all such ranges are encompassed within the invention. Where a value being discussed has inherent limits, for example where a component can be present at a concentration of from 0 to 100%, or where the pH of an aqueous solution can range from 1 to 14, those inherent limits are specifically disclosed as are ranges based on those inherent limits. Where a value is explicitly recited, it is to be understood that values which are about the same quantity or amount as the recited value are also within the scope of the invention, as are ranges based thereon with any other value as described herein.

Where a combination or group of elements is disclosed, each subset of those elements is also specifically disclosed and is within the scope of the invention. Conversely, where different elements or groups of elements are disclosed, combinations thereof are also disclosed.

Where any element of an invention is disclosed as having a plurality of alternatives, examples of that invention in which each alternative is excluded singly or in any combination with the other alternatives are also hereby disclosed; more than one element of an invention can have such exclusions, and all combinations of elements having such exclusions are hereby disclosed.

Unless defined otherwise or the context clearly dictates otherwise, all technical and scientific terms used herein have the same meaning as commonly understood by one of ordinary skill in the art to which this invention belongs. Although any methods and materials similar or equivalent to those described herein can be used in the practice or testing of the invention, the preferred methods and materials are now described.

All publications mentioned herein are hereby incorporated by reference for the purpose of disclosing and describing the particular materials and methodologies for which the reference was cited. The publications discussed herein are provided solely for their disclosure prior to the filing date of the present application. Nothing herein is to be construed as an admission that the invention is not entitled to antedate such disclosure by virtue of prior invention.

Definitions

In describing the present invention, the following terms will be employed, and are intended to be defined as indicated below.

"Alkyl" refers to a branched, unbranched or cyclic saturated hydrocarbon group of 1 to 24 carbon atoms optionally substituted at one or more positions, and includes polycyclic compounds. Examples of alkyl groups include optionally substituted methyl, ethyl, n-propyl, isopropyl, n-butyl, s-butyl, t-butyl, n-pentyl, isopentyl, neopentyl, n-hexyl, n-heptyl, n-octyl, n-decyl, hexyloctyl, tetradecyl, hexadecyl, eicosyl, tetracosyl and the like, as well as cycloalkyl groups such as cyclopropyl, cyclobutyl, cyclopentyl, cyclohexyl, cycloheptyl, cyclooctyl, adamantyl, and norbornyl. The term "lower alkyl" refers to an alkyl group of 1 to 6 carbon atoms, preferably 1 to 4 carbon atoms. Exemplary substituents on substituted alkyl groups include hydroxyl, cyano, alkoxy, =O, =S, —$NO_2$, halogen, haloalkyl, heteroalkyl, carboxyalkyl, amine, amide, thioether and —SH.

"Alkoxy" refers to an "—Oalkyl" group, where alkyl is as defined above. A "lower alkoxy" group intends an alkoxy group containing one to six, more preferably one to four, carbon atoms.

"Alkenyl" refers to an unsaturated branched, unbranched or cyclic hydrocarbon group of 2 to 24 carbon atoms containing at least one carbon-carbon double bond and optionally substituted at one or more positions. Examples of alkenyl groups include ethenyl, 1-propenyl, 2-propenyl (allyl), 1-methylvinyl, cyclopropenyl, 1-butenyl, 2-butenyl, isobutenyl, 1,4-butadienyl, cyclobutenyl, 1-methylbut-2-enyl, 2-methylbut-2-en-4-yl, prenyl, pent-1-enyl, pent-3-enyl, 1,1-dimethylallyl, cyclopentenyl, hex-2-enyl, 1-methyl-1-ethylallyl, cyclohexenyl, heptenyl, cycloheptenyl, octenyl, cyclooctenyl, decenyl, tetradecenyl, hexadecenyl, eicosenyl, tetracosenyl and the like. Preferred alkenyl groups herein contain 2 to 12 carbon atoms. The term "lower alkenyl" intends an alkenyl group of 2 to 6 carbon atoms, preferably 2 to 4 carbon atoms. The term "cycloalkenyl" intends a cyclic alkenyl group of 3 to 8, preferably 5 or 6, carbon atoms. Exemplary substituents on substituted alkenyl groups include hydroxyl, cyano, alkoxy, =O, =S, —$NO_2$, halogen, haloalkyl, heteroalkyl, amine, thioether and —SH.

"Alkenyloxy" refers to an "—Oalkenyl" group, wherein alkenyl is as defined above.

"Alkylaryl" refers to an alkyl group that is covalently joined to an aryl group. Preferably, the alkyl is a lower allyl.

Exemplary alkylaryl groups include benzyl, phenethyl, phenopropyl, 1-benzylethyl, phenobutyl, 2-benzylpropyl and the like.

"Alkylaryloxy" refers to an "—Oalkylaryl" group, where alkylaryl is as defined above.

"Alkynyl" refers to an unsaturated branched or unbranched hydrocarbon group of 2 to 24 carbon atoms containing at least one —C≡C— triple bond, optionally substituted at one or more positions. Examples of alkynyl groups include ethynyl, n-propynyl, isopropynyl, propargyl, but-2-ynyl, 3-methylbut-1-ynyl, octynyl, decynyl and the like. Preferred alkynyl groups herein contain 2 to 12 carbon atoms. The term "lower alkynyl" intends an alkynyl group of 2 to 6, preferably 2 to 4, carbon atoms, and one —C≡C— triple bond. Exemplary substituents on substituted alkynyl groups include hydroxyl, cyano, alkoxy, =O, =S, —NO$_2$, halogen, haloalkyl, heteroalkyl, amine, thioether and —SH.

"Amide" refers to —C(O)NR'R", where R' and R" are independently selected from hydrogen, alkyl, aryl, and alkylaryl.

"Amine" refers to an —N(R')R" group, where R' and R" are independently selected from hydrogen, alkyl, aryl, and alkylaryl.

"Aryl" refers to an aromatic group that has at least one ring having a conjugated pi electron system and includes carbocyclic, heterocyclic, bridged and/or polycyclic aryl groups, and can be optionally substituted at one or more positions. Typical aryl groups contain 1 to 5 aromatic rings, which may be fused and/or linked. Exemplary aryl groups include phenyl, furanyl, azolyl, thiofuranyl, pyridyl, pyrimidyl, pyrazinyl, triazinyl, biphenyl, indenyl, benzofuranyl, indolyl, naphthyl, quinolinyl, isoquinolinyl, quinazolinyl, pyridopyridinyl, pyrrolopyridinyl, purinyl, tetralinyl and the like. Exemplary substituents on optionally substituted aryl groups include alkyl, alkoxy, alkylcarboxy, alkenyl, alkenyloxy, alkenylcarboxy, aryl, aryloxy, alkylaryl, alkylaryloxy, fused saturated or unsaturated optionally substituted rings, halogen, haloalkyl, heteroalkyl, —S(O)R, sulfonyl, —SO$_3$R, —SR, —NO$_2$, —NRR', —OH, —CN, —C(O)R, —OC(O)R, —NHC(O)R, —(CH$_2$)$_n$CO$_2$R or —(CH$_2$)$_n$CONRR' where n is 0-4, and wherein R and R' are independently H, alkyl, aryl or alkylaryl.

"Aryloxy" refers to an "—Oaryl" group, where aryl is as defined above.

"Carbocyclic" refers to an optionally substituted compound containing at least one ring and wherein all ring atoms are carbon, and can be saturated or unsaturated.

"Carbocyclic aryl" refers to an optionally substituted aryl group wherein the ring atoms are carbon.

"Halo" or "halogen" refers to fluoro, chloro, bromo or iodo. "Halide" refers to the anionic form of the halogens.

"Haloalkyl" refers to an alkyl group substituted at one or more positions with a halogen, and includes alkyl groups substituted with only one type of halogen atom as well as alkyl groups substituted with a mixture of different types of halogen atoms. Exemplary haloalkyl groups include trihalomethyl groups, for example trifluoromethyl.

"Heteroalkyl" refers to an alkyl group wherein one or more carbon atoms and associated hydrogen atom(s) are replaced by an optionally substituted heteroatom, and includes alkyl groups substituted with only one type of heteroatom as well as alkyl groups substituted with a mixture of different types of heteroatoms. Heteroatoms include oxygen, sulfur, and nitrogen. As used herein, nitrogen heteroatoms and sulfur heteroatoms include any oxidized form of nitrogen and sulfur, and any form of nitrogen having four covalent bonds including protonated and alkylated forms. An optionally substituted heteroatom refers to a heteroatom having one or more attached hydrogens optionally replaced with alkyl, aryl, alkylaryl and/or hydroxyl.

"Heterocyclic" refers to a compound containing at least one saturated or unsaturated ring having at least one heteroatom and optionally substituted at one or more positions. Typical heterocyclic groups contain 1 to 5 rings, which may be fused and/or linked, where the rings each contain five or six atoms. Examples of heterocyclic groups include piperidinyl, morpholinyl and pyrrolidinyl. Exemplary substituents for optionally substituted heterocyclic groups are as for alkyl and aryl at ring carbons and as for heteroalkyl at heteroatoms.

"Heterocyclic aryl" refers to an aryl group having at least 1 heteroatom in at least one aromatic ring. Exemplary heterocyclic aryl groups include furanyl, thienyl, pyridyl, pyridazinyl, pyrrolyl, N-lower alkyl-pyrrolo, pyrimidyl, pyrazinyl, triazinyl, tetrazinyl, triazolyl, tetrazolyl, imidazolyl, bipyridyl, tripyridyl, tetrapyridyl, phenazinyl, phenanthrolinyl, purinyl and the like.

"Hydrocarbyl" refers to hydrocarbyl substituents containing 1 to about 20 carbon atoms, including branched, unbranched and cyclic species as well as saturated and unsaturated species, for example alkyl groups, alkylidenyl groups, alkenyl groups, alkylaryl groups, aryl groups, and the like. The term "lower hydrocarbyl" intends a hydrocarbyl group of one to six carbon atoms, preferably one to four carbon atoms.

A "substituent" refers to a group that replaces one or more hydrogens attached to a carbon or nitrogen. Exemplary substituents include alkyl, alkylidenyl, alkylcarboxy, alkoxy, alkenyl, alkenylcarboxy, alkenyloxy, aryl, aryloxy, alkylaryl, alkylaryloxy, —OH, amide, carboxamide, carboxy, sulfonyl, =O, =S, —NO$_2$, halogen, haloalkyl, fused saturated or unsaturated optionally substituted rings, —S(O)R, —SO$_3$R, —SR, —NRR', —OH, —CN, —C(O)R, —OC(O)R, —NHC(O)R, —(CH$_2$)$_n$CO$_2$R or —(CH$_2$)$_n$CONRR' where n is 0-4, and wherein R and R' are independently H, alkyl, aryl or alkylaryl. Substituents also include replacement of a carbon atom and one or more associated hydrogen atoms with an optionally substituted heteroatom.

"Sulfonyl" refers to —S(O)$_2$R, where R is alkyl, aryl, —C(CN)=C-aryl, —CH$_2$CN, alkylaryl, or amine.

"Tioamide" refers to —C(S)NR'R", where R' and R" are independently selected from hydrogen, alkyl, aryl, and alkylaryl.

"Thioether" refers to —SR, where R is alkyl, aryl, or alkylaryl.

"Multiplexing" herein refers to an assay or other analytical method in which multiple analytes can be assayed simultaneously.

"Optional" or "optionally" means that the subsequently described event or circumstance may or may not occur, and that the description includes instances where said event or circumstance occurs singly or multiply and instances where it does not occur at all. For example, the phrase "optionally substituted alkyl" means an alkyl moiety that may or may not be substituted and the description includes both unsubstituted, monosubstituted, and polysubstituted alkyls.

Conjugated Polymer Soluble in Polar Media

Conjugated polymers (CPs) soluble in polar media are provided and can be used in embodiments described herein. The CPs comprise polar groups as solubilizing functionalities linked to polymer subunits to increase polymer solubility in polar media. Any or all of the subunits of the CP may comprise one or more pendant solubilizing groups. Exemplary polar groups include those introducing one or more dipole moments to the CP, for example halides, hydroxyls, amines, amides, cyano, carboxylic acids, and thiols.

Preferably the polar groups are charged groups, more preferably cationic groups. Any suitable cationic groups may be incorporated into CCPs. Exemplary cationic groups which may be incorporated include ammonium groups, guanidinium groups, histidines, polyamines, pyridinium groups, and sulfonium groups.

The solubilizing functionality may be linked to the conjugated polymer backbone by a linker, preferably an unconjugated linker, for example alkyl groups, polyethers, alkylamines, and/or polyamines.

One synthetic approach to introducing a charged group into a conjugated polymer is as follows. A neutral polymer is first formed by the Suzuki coupling of one or more bis- (or tris- etc.) boronic acid-substituted monomer(s) with one or more monomers that have at least two bromine substitutions on aromatic ring positions. Bromine groups are attached to any or all of the monomers via linkers. Conversion to cationic water-soluble polymers is accomplished by addition of condensed trimethylamine, which replaces the pendant bromines with ammonium groups.

In some embodiments, the conjugated polymer may desirably comprise conductive monomers which alter the conductivity of the overall polymer, increasing its ability to transport an electrical species. For example, the conjugated polymer can comprise monomer(s) which improve its ability to inject and/or transport electrons. The conjugated polymer can comprise monomer(s) which improve its ability to inject and/or transport holes. More than one type of conductive monomer can be incorporated in the conjugated polymer. The conductivity of such polymers can be controlled through the type and/or amount of monomer(s) used, which can be selected to provide an electronic configuration compatible with other materials of interest in a given electronic device.

The conductive monomers may be electron-deficient monomers or electron-rich monomers. Electron-deficient monomers can be used to increase the ability of the polymer to inject and/or transport electrons, and to improve its ability to serve as an electron-transport layer. Electron-deficient monomers include unsaturated and/or aromatic groups appropriately substituted with electron-withdrawing groups. A number of electron-deficient monomers are known in the art. Exemplary electron-deficient monomers include benzothiadiazole, oxadiazole, quinoxaline, cyano-substituted olefins, squaric acid, and maleimide.

Electron-rich monomers can be used to increase the ability of the polymer to inject and/or transport holes, and to improve its ability to serve as a hole-transport layer. Electron-rich monomers include unsaturated and/or aromatic groups appropriately substituted with electron-donating groups, for example alkyl groups. A number of electron-rich monomers are known in the art. Exemplary electron-rich monomers include 9,9-dialkylfluorenes, 2,5-dimethyl-1,4-phenylidene, 2,5-dioctyloxy-1,4-phenylidene, and terthiophenes.

The composition of the polymer can also be chosen to prevent conductivity of certain species. For example, the composition of the polymer can be chosen so that it has hole-blocking properties, which can be desirable in certain device configurations, for example in polymer light-emitting diodes (PLEDs).

In some embodiments the polymers can comprise angled linkers with a substitution pattern (or regiochemistry) capable of perturbing the polymers' ability to form rigid-rod structures, allowing them to have a greater range of three-dimensional structures. The polymers can comprise at least three subunits with at least one angled linker, which may be internal and/or an end unit, and may comprise at least 4, 5, 6, 8, 10, 15, 20, 25 or more subunits. The polymers may comprise up to about 100, 200, 300, 500, 1000, 2000, 5000, 10000, 20000, 50000 or more subunits.

The angled linker(s) are optionally substituted aromatic molecules having at least two separate bonds to other polymer components (e.g., monomers, block polymers, end groups) that are capable of forming angles relative to one another which disrupt the overall ability of the polymer to form an extended rigid-rod structure (although significant regions exhibiting such structure may remain.) The angled linkers may be bivalent or polyvalent.

The angle which the angled linkers are capable of imparting to the polymeric structure is determined as follows. Where the two bonds to other polymeric components are coplanar, the angle can be determined by extending lines representing those bonds to the point at which they intersect, and then measuring the angle between them. Where the two bonds to other polymeric components are not coplanar, the angle can be determined as follows: a first line is drawn between the two ring atoms to which the bonds attach; two bond lines are drawn, one extending from each ring atom in the direction of its respective bond to the other polymeric component to which it is joined; the angle between each bond line and the first line is fixed; and the two ring atoms are then merged into a single point by shrinking the first line to a zero length; the angle then resulting between the two bond lines is the angle the angled linker imparts to the polymer.

The angle which an angled linker is capable of imparting to the polymer is typically less than about 155°, and may be less than about 150°, less than about 145°, less than about 140°, less than about 135°, less than about 130°, less than about 125°, less than about 120°, less than about 115°, less than about 110°, less than about 105°, less than about 100°, less than about 95°, less than about 90°, less than about 85°, less than about 80°, less than about 75°, less than about 70°, less than about 65°, less than about 60°, less than about 55°, or less than about 50°. The angled linker may form an angle to its adjacent polymeric units of about 25°, 30°, 35°, 40°, 45°, 50°, 60° or more. The angled linker may introduce a torsional twist in the conjugated polymer, thereby further disrupting the ability of the polymer to form a rigid-rod structure. For angled linkers having an internally rotatable bond, such as polysubstituted biphenyl, the angled linker must be capable of imparting an angle of less than about 155° in at least one orientation.

For six-membered rings, such angles can be achieved through ortho or meta linkages to the rest of the polymer. For five-membered rings, adjacent linkages fall within this range. For eight-membered rings, linkages extending from adjacent ring atoms, from alternate ring atoms (separated by one ring atom), and from ring atoms separated by two other ring atoms fall within this range. Ring systems with more than eight ring atoms may be used. For polycyclic structures, even more diverse linkage angles can be achieved.

Exemplary linking units which meet these limitations include benzene derivatives incorporated into the polymer in the 1, 2 or 1,3-positions; naphthalene derivatives incorporated into the polymer in the 1,2-, 1,3-, 1,6-, 1,7-, 1,8-positions; anthracene derivatives incorporated into the polymer in the 1,2-, 1,3-, 1,6-, 1,7-, 1,8-, and 1,9-positions; biphenyl derivatives incorporated into the polymer in the 2,3-, 2,4-, 2,6-, 3,3'-, 3,4-, 3,5-, 2,2'-, 2,3'-, 2,4'-, and 3,4'-positions; and corresponding heterocycles. The position numbers are given with reference to unsubstituted carbon-based rings, but the same relative positions of incorporation in the polymer are encompassed in substituted rings and/or heterocycles should their distribution of substituents change the ring numbering.

The CP can be a copolymer, and may be a block copolymer, a graft copolymer, or both. The solubilizing functionalities, the conductive subunits and/or the angled linkers may be incorporated into the CP randomly, alternately, periodically and/or in blocks.

Exemplary polymers which may form the backbone of the compounds of the present invention include, for example, polypyrroles, polyfluorenes, polyphenylene-vinylenes, polythiophenes, polyisothianaphthenes, polyanilines, poly-p-phenylenes and copolymers thereof. Other exemplary polymeric subunits and repeating units are shown in the accompanying tables.

TABLE 1

Typical aromatic repeat units for the construction of conjugated segments and oligomeric structures.

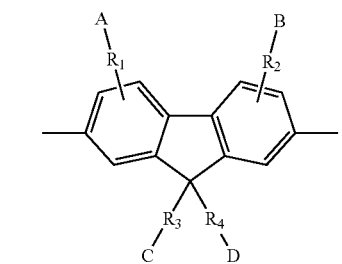

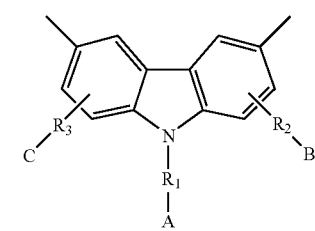

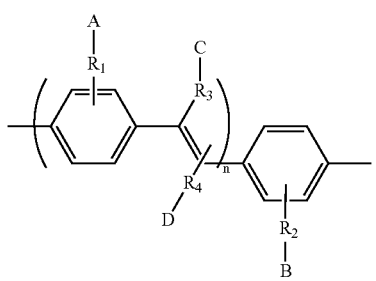

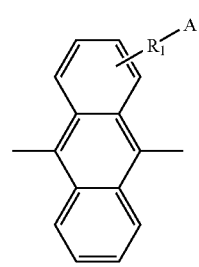

TABLE 1-continued

Typical aromatic repeat units for the construction of conjugated segments and oligomeric structures.

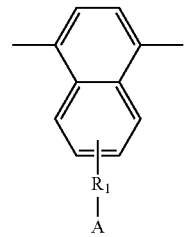

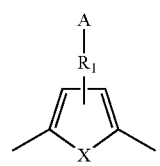

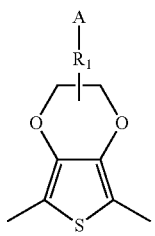

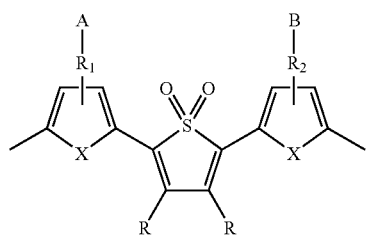

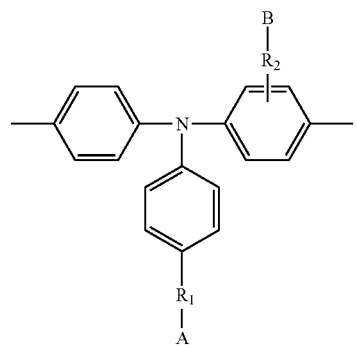

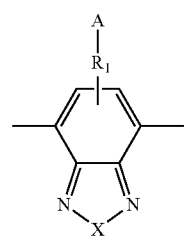

TABLE 1-continued
Typical aromatic repeat units for the construction of conjugated segments and oligomeric structures.
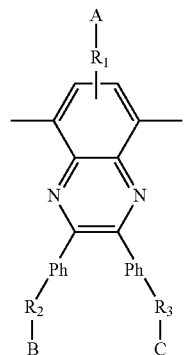
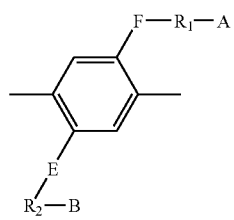
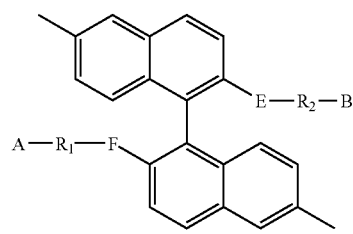
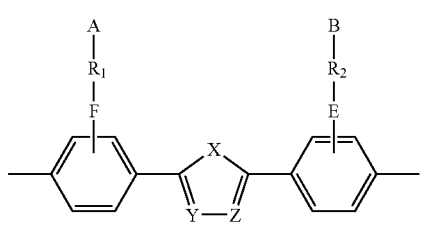
TABLE 2
Examples of conjugated segments and oligomeric structures of CP
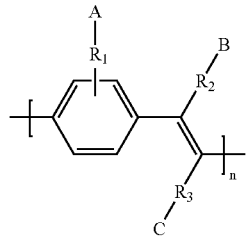
TABLE 2-continued
Examples of conjugated segments and oligomeric structures of CP
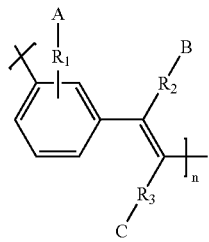
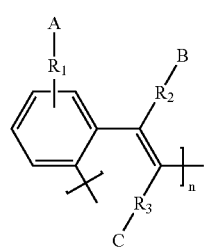
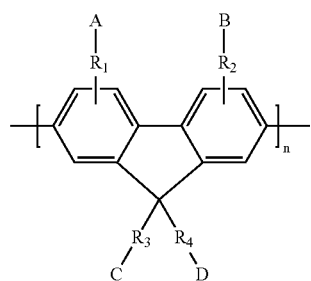
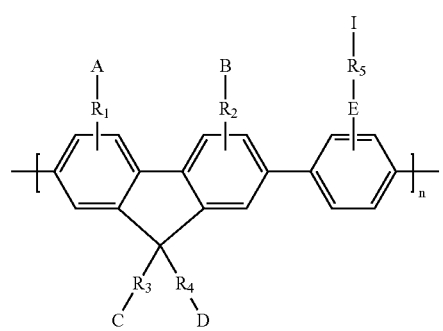
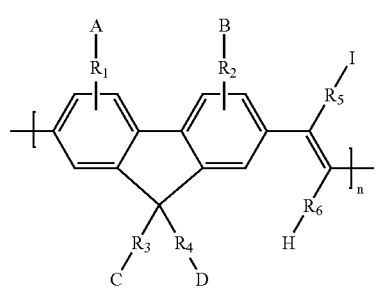

TABLE 2-continued
Examples of conjugated segments and oligomeric structures of CP
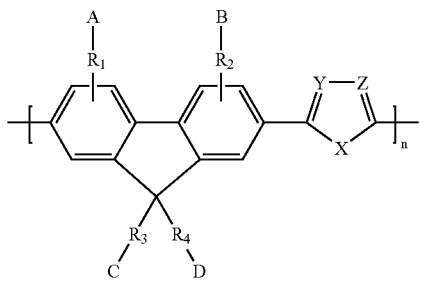
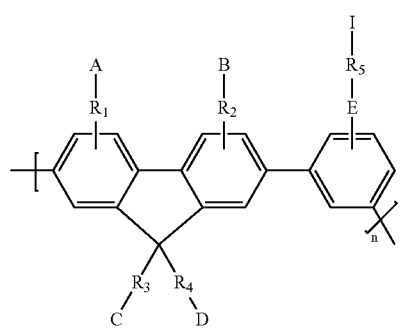
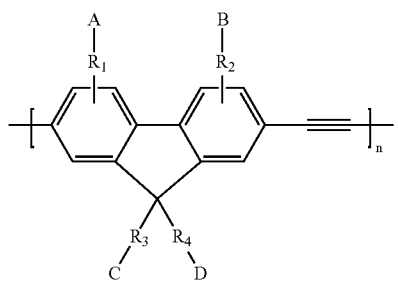
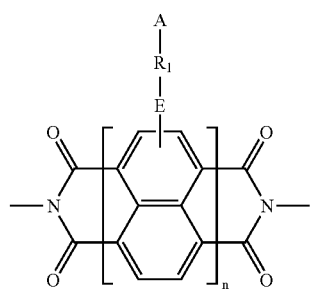
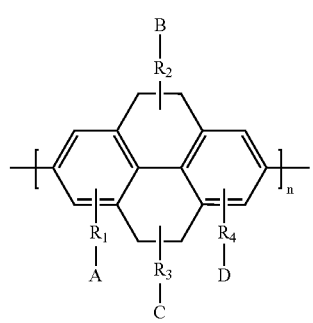
TABLE 2-continued
Examples of conjugated segments and oligomeric structures of CP
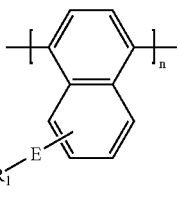
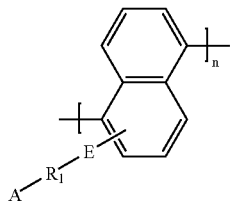
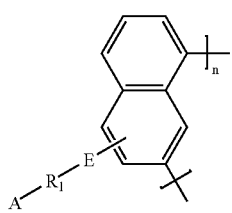
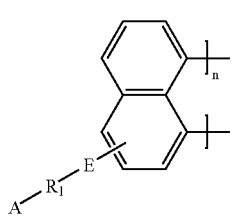
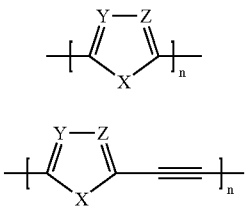
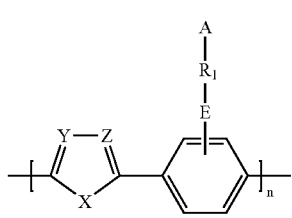
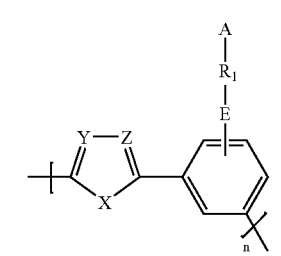

TABLE 2-continued
Examples of conjugated segments and oligomeric structures of CP
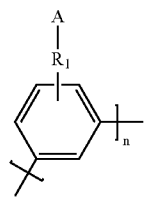
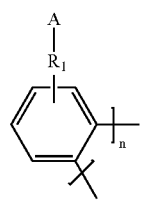
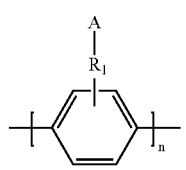
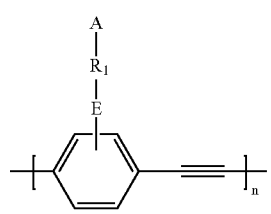
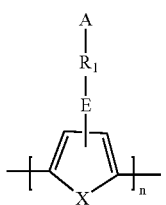
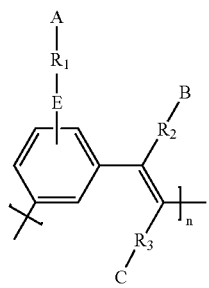
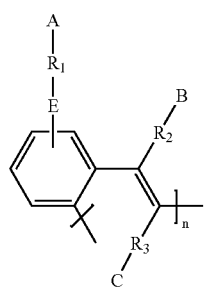
TABLE 2-continued
Examples of conjugated segments and oligomeric structures of CP
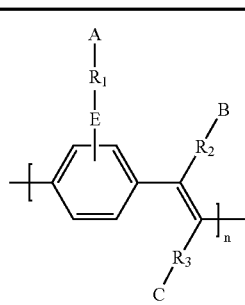
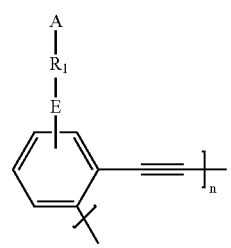
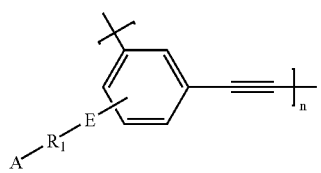
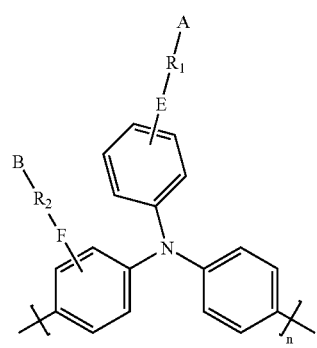
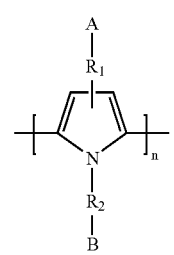
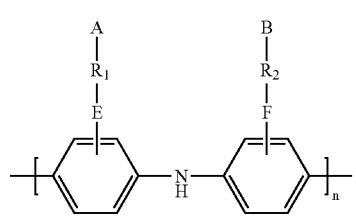

TABLE 2-continued
Examples of conjugated segments and oligomeric structures of CP
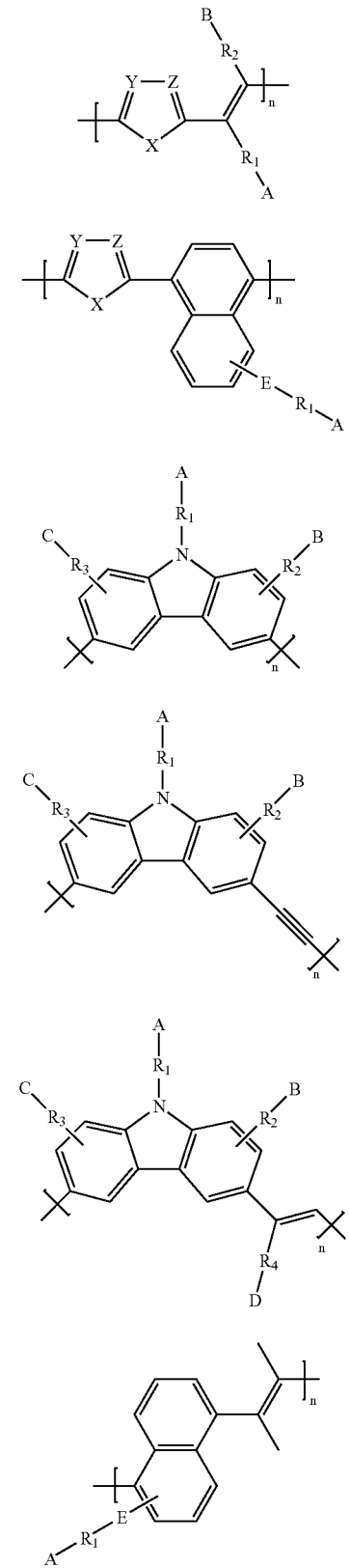
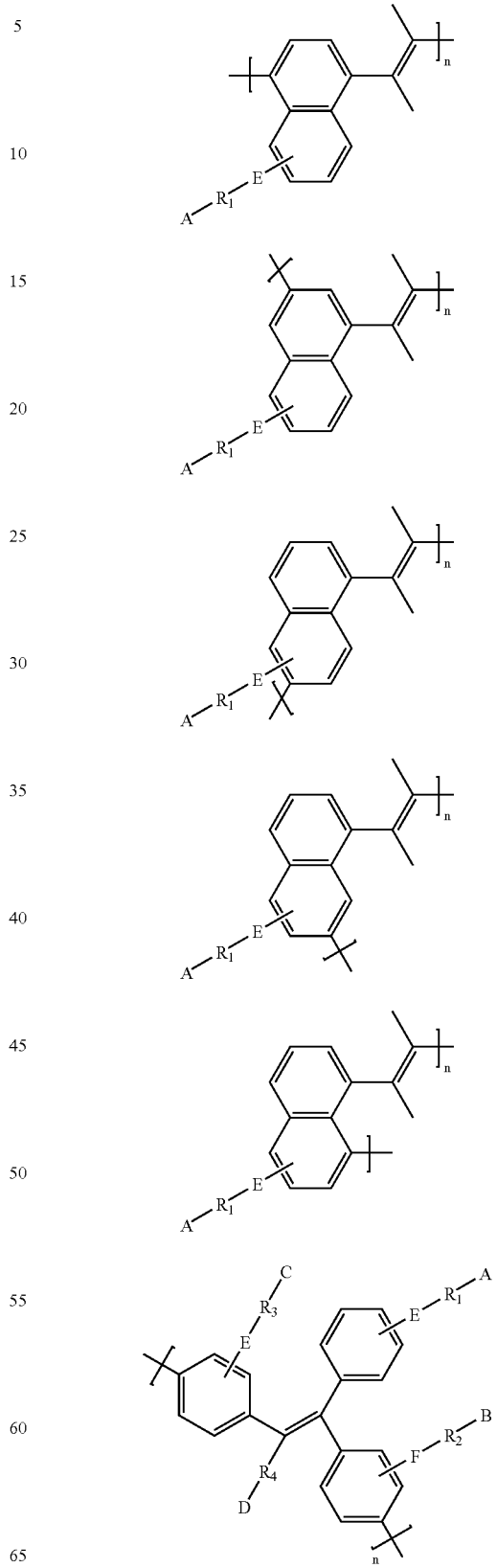

TABLE 2-continued

Examples of conjugated segments and oligomeric structures of CP

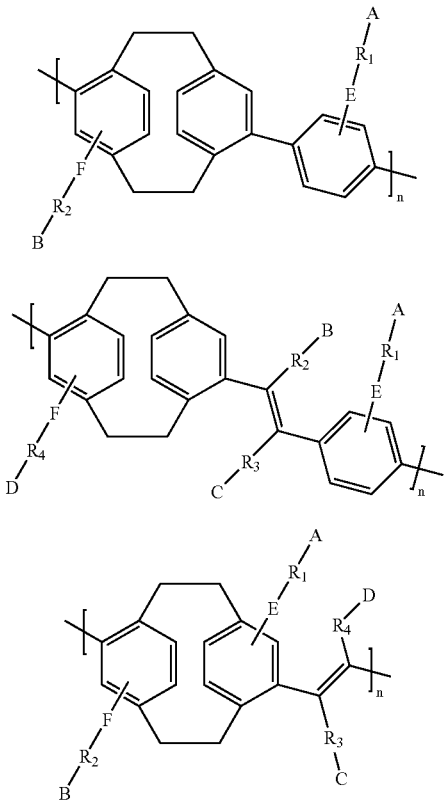

The CP contains a sufficient density of solubilizing functionalities to render the overall polymer soluble in a polar medium. The CP preferably contains at least about 0.01 mol % of the monomers substituted with at least one solubilizing functionality, and may contain at least about 0.02 mol %, at least about 0.05 mol %, at least about 0.1 mol %, at least about 0.2 mol %, at least about 0.5 mol %, at least about 1 mol %, at least about 2 mol %, at least about 5 mol %, at least about 10 mol %, at least about 20 mol %, or at least about 30 mol %. The CP may contain up to 100 mol % of the solubilizing functionality, and may contain about 99 mol % or less, about 90 mol % or less, about 80 mol % or less, about 70 mol % or less, about 60 mol % or less, about 50 mol % or less, or about 40 mol % or less.

The CP preferably contains at least about 0.01 mol % of the conductive monomers, and may contain at least about 0.02 mol %, at least about 0.05 mol %, at least about 0.1 mol %, at least about 0.2 mol %, at least about 0.5 mol %, at least about 1 mol %, at least about 2 mol %, at least about 5 mol %, at least about 10 mol %, at least about 20 mol %, or at least about 30 mol %. The CP may contain up to 100 mol % of the conductive monomers, and may contain about 99 mol % or less, about 90 mol % or less, about 80 mol % or less, about 70 mol % or less, about 60 mol % or less, about 50 mol % or less, or about 40 mol % or less.

The polymer may contain at least about 0.01 mol % of the angled linker, and may contain at least about 0.02 mol %, at least about 0.05 mol %, at least about 0.1 mol %, at least about 0.2 mol %, at least about 0.5 mol %, at least about 1 mol %, at least about 2 mol %, at least about 5 mol %, at least about 10 mol %, at least about 20 mol %, or at least about 30 mol %. The polymer may contain up to 100 mol % of the angled linker, and may contain about 99 mol % or less, about 90 mol % or less, about 80 mol % or less, about 70 mol % or less, about 60 mol % or less, about 50 mol % or less, or about 40 mol % or less.

Desirably, the CPs described herein are soluble in aqueous solutions and other highly polar solvents, and preferably are soluble in water. By "water-soluble" is meant that the material exhibits solubility in a predominantly aqueous solution, which, although comprising more than 50% by volume of water, does not exclude other substances from that solution, including without limitation buffers, blocking agents, cosolvents, salts, metal ions and detergents.

In one embodiment, an exemplary CCP is represented by Formula A:

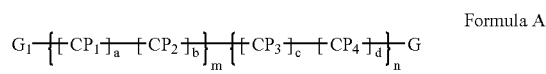

Formula A wherein:

$CP_1$, $CP_2$, $CP_3$, and $CP_4$ are optionally substituted conjugated polymer segments or oligomeric structures, and may be the same or different from one another. $CP_1$, $CP_2$, $CP_3$, and $CP_4$ may be aromatic repeat units, and may be selected from the group consisting of benzene, naphthalene, anthracene, fluorene, thiophene, furan, pyridine, and oxadiazole, each optionally substituted. Typical aromatic repeat units are shown in Table 1 below, and representative polymeric segments and oligomeric structures are shown in Table 2. One or more of $CP_{1-4}$ may be conductive monomers comprising electron-injecting and/or transporting properties or hole-injecting and/or transporting properties. The conductive monomers may be evenly or randomly distributed along the polymer main chain.

$CP_1$, $CP_2$, $CP_3$ and $CP_4$ are each optionally substituted at one or more positions with one or more groups selected from $-R_1-A$, $-R_2-B$, $-R_3-C$ and $-R_4-D$, which may be attached through bridging functional groups -E- and —F—, with the proviso that the polymer as a whole must be substituted with a plurality of cationic groups.

$R_1$, $R_2$, $R_3$ and $R_4$ are independently selected from alkyl, alkenyl, alkoxy, alkynyl, and aryl, alkylaryl, arylalkyl, and polyalkylene oxide, each optionally substituted, which may contain one or more heteroatoms, or may be not present. $R_1$, $R_2$, $R_3$ and $R_4$ can be independently selected from $C_{1-22}$ alkyl, $C_{1-22}$ alkoxy, $C_{1-22}$ ester, polyalkylene oxide having from 1 to about 22 carbon atoms, cyclic crown ether having from 1 to about 22 carbon atoms, or not present. Preferably, $R_1$, $R_2$, $R_3$ and $R_4$ may be selected from straight or branched alkyl groups having 1 to about 12 carbon atoms, or alkoxy groups with 1 to about 12 carbon atoms. It is to be understood that more than one functional group may be appended to the rings as indicated in the formulas at one or more positions.

A, B, C and D are independently selected from H, —SiR'R"R'", —N⁺R'R"R'", a guanidinium group, histidine, a polyamine, a pyridinium group, and a sulfonium group. R', R" and R'" are independently selected from the group consisting of hydrogen, $C_{1-12}$ alkyl and $C_{1-12}$ alkoxy and $C_{3-10}$ cycloalkyl. It is preferred that R', R" and R'" are lower alkyl or lower alkoxy groups.

E and F are independently selected from not present, —O—, —S—, —C(O)—, —C(O)O—, —C(R)(R')—, —N(R')—, and —Si(R')(R"), wherein R' and R" are as defined above.

X is O, S, Se, —N(R')— or —C(R')(R")—, and Y and Z are independently selected from —C(R)= and —N=, where R, R' and R" are as defined above.

m and n are independently 0 to about 10,000, wherein m+n>1. Preferably m and n are each independently 0 to about 20 and more preferably from 0 to about 10. Each repeat of m and n may be the same as or different than the other repeats.

a, b, c and d are independently 0 to about 250. At least one of a, b, c and d must be greater than or equal to one.

G and G1 are capping units and may be the same or different. The capping units may be activated units that allow further chemical reaction to extend the polymer chain, or may be nonactivated termination units. G and G1 can be independently selected from hydrogen, optionally substituted aryl, halogen substituted aryl, boronic acid substituted aryl, and boronate radical substituted aryl.

Conjugated polymers may also be provided in purified form. Any available method or combination of methods may be used for purification. Exemplary methods include precipitation, extraction, and sublimation. Solutions of the CP are also provided. Solutions may be provided in a container of any suitable form. Solutions may be packaged in a container designed for incorporation into a solution processing apparatus, for example a printer. In some embodiments, the solution may be provided in an inkjet cartridge designed to be used with an inkjet printer.

The Polar Solvent

The conjugated polymer is soluble in a polar medium, a medium comprising at least one polar solvent. By "polar" is meant having a net dipole moment. Exemplary polar solvents include dimethylsulfoxide, dimethylformamide, formic acid, acetic acid, ethyl acetate, water, alcohols and polyalcohols, particularly lower alcohols ($C_{1-4}$), particularly methanol. Preferably the polar solvent has a polarity of at least that of ethanol or ethyl acetate. In some embodiments, the polar solvent used to dissolve the CP is selected based on its inability to dissolve a second conjugated polymer onto which the CP is to be deposited.

The polar solvent in certain embodiments and solution formed therefrom in some embodiments is wettable on the surface to which it is to be applied, such that when it is deposited it flows generally uniformly and evenly over the surface, and preferably is controllable in thickness. Combinations of solvents may also be used. Preferably the solvent is sufficiently wettable on the substrate that the solution spreads appropriately when deposited thereon. One or more wetting agents may be included in the solution to improve its ability to wet a surface and/or lowers its surface tension. For example, a solution comprising water may have an alcohol, a surfactant, or a combination of materials added thereto serving as wetting agents.

Methods of Use

The CPs described herein can be used in a variety of methods. Methods of particular interest include deposition of the CPs into electronic devices, particularly in devices comprising multiple layers of conjugated polymers. Any of a variety of deposition methods can be used in a given device, including without limitation vacuum sputtering (RF or Magnetron), electron beam evaporation, thermal vapor deposition, chemical deposition, sublimation, and solution processing methods. Any deposition method known or discoverable in the art can be used to deposit the soluble polar polymers provided herein, although solution methods are currently preferred.

These layers are commonly deposited by spin-coating, drop-casting, sequential spin-casting, formation of Langinuir-Blodgett films or electrostatic adsorption techniques.[28] Articles of manufacture may be fabricated by stepwise deposition of polymer layers; the water solubility of flexible CPs provided herein allows for the sequential deposition of layers of different materials with different solubilities, providing certain advantages during manufacturing, including for the deposition of thin layers of material.

In particular embodiments, solution processing methods can be used to incorporate CPs into an article of manufacture. Printing techniques may advantageously be used to deposit the CPs, e.g., inkjet printing, offset printing, etc.

Where the CPs are used in multilayer devices comprising multiple conjugated polymeric layers, one or more of these layers may comprise nonpolar conjugated polymers which may not be soluble in a polar medium of interest. These include, for example, MEH-PPV, P3ATs [poly(3-alkylthiophenes), where alkyl is from 6 to 16 carbons], such as poly(2,5-dimethoxy-p-phenylene vinylene)-"PDMPV", and poly(2,5-thienylenevinylene); poly(phenylenevinylene) or "PPV" and alkoxy derivatives thereof; PFO, PFO-BT, and polyanilines. The nonpolar conjugated polymer can be deposited by any suitable technique; in some embodiments it is deposited or cast directly from solution. Typically, organic solvents are used, typically with low polarity. Exemplary organic solvents include: halohydrocarbons such as methylene chloride, chloroform, and carbon tetrachloride; aromatic hydrocarbons such as xylene, benzene, toluene; and other hydrocarbons including decaline.

Mixed solvents can also be used. The differing solubility properties of nonpolar and polar polymers allow for deposition of multiple polymeric layers via solution processing methods, which can simplify manufacturing and reduce costs. The water-soluble polymers described herein allow for the solution deposition of alternating layers of polymers of differing solubilities to form bilayer or multilayer devices.

When depositing the conjugated polymer on a substrate, the solution can be relatively dilute, such as from 0.1 to 20% w/w in concentration, especially 0.2 to 5% w. In some embodiments, film thicknesses may be at least about 50, 100, or 200 nm. In some embodiments, film thicknesses of less than about 400, 200, or 100 nm can be used.

The polymer solution can be formed into a selected shape if desired, e.g. a fiber, film or the like by any suitable method, for example extrusion.

After deposition of a solution comprising a conjugated polymer, the solvent is removed. Any available method or combination of methods may be used for removing the solvent. Exemplary solvent removal methods include evaporation, heating, extraction, and subjecting the solution to a vacuum.

In some embodiments, the conjugated polymer may be deposited on a substrate. The substrate can comprise a wide range of material, either biological, nonbiological, organic, inorganic, or a combination of any of these. In some embodiments, the substrate can be transparent. The substrate can be a rigid material, for example a rigid plastic or a rigid inorganic oxide. The substrate can be a flexible material, for example a transparent organic polymer such as polyethyleneterephthalate or a flexible polycarbonate. The substrate can be conductive or nonconductive.

The CPs can be deposited on a substrate in any of a variety of formats. For example, the substrate may be a polymerized Langmuir Blodgett film, functionalized glass, Si, Ge, GaAs, indium doped GaN, GaP, SiC (Nature 430:1009, 2004), SiO2, SiN4, semiconductor nanocrystals, modified silicon, or any of a wide variety of gels or polymers such as (poly)tetrafluoroethylene, (poly)vinylidenedifluoride, polystyrene, cross-linked polystyrene, polyacrylic, polylactic acid, polyglycolic acid, poly(lactide coglycolide), polyanhydrides, poly(methyl methacrylate), poly(ethylene-co-vinyl acetate), polyethyleneterephthalate, polysiloxanes, polymeric silica, latexes, dextran polymers, epoxies, polycarbonates, agarose, poly(acrylamide) or combinations thereof. Conducting polymers and photoconductive materials can be used. The substrate can take the form of a photodiode, an optoelectronic sensor such as an optoelectronic semiconductor chip or optoelectronic thin-film semiconductor, or abiochip.

The CPs may be used in methods which screen the CPs for any property of interest. For example, the CPs may be tested for binding to a target, for energy transfer to a chromophore, for increased fluorescent efficiency, for decreased self-quenching, for absorbance wavelength, emission wavelength, conductive properties, ability to inject and/or transport electrons, ability to block holes, ability to inject and/or transport holes, and/or work function, etc.

Articles of Manufacture

The CPs can be incorporated into any of various articles of manufacture including optoelectronic or electronic devices, biosensors, diodes, including photodiodes and light-emitting diodes ("LEDs"), optoelectronic semiconductor chips, semiconductor thin-films, and chips, and can be used in array or microarray form. The polymer can be incorporated into a polymeric photoswitch. The polymer can be incorporated into an optical interconnect or a transducer to convert a light signal to an electrical impulse. The CPs can serve as liquid crystal materials. The CPs may be used as electrodes in electrochemical cells, as conductive layers in electrochromic displays, as field effective transistors, and as Schottky diodes.

The CPs can be used as lasing materials. Optically pumped laser emission has been reported from MEH-PPV in dilute solution in an appropriate solvent, in direct analogy with conventional dye lasers [D. Moses, Appl. Phys. Lett. 60, 3215 (1992); U.S. Pat. No. 5,237,582]. Semiconducting polymers in the form of neat undiluted films have been demonstrated as active luminescent materials in solid state lasers [F. Hide, M. A. Diaz-Garcia, B. J. Schwartz, M. R. Andersson, Q. Pei, and A. J. Heeger, Science 273, 1833 (1996); N. Tessler, G. J. Denton, and R. H. Friend, Nature 382, 695 (1996)]. The use of semiconducting polymers as materials for solid state lasers is disclosed in U.S. Pat. No. 5,881,083 issued Mar. 9, 1999 to Diaz-Garcia et al. and titled "Conjugated Polymers as Materials for Solid State Lasers." In semiconducting polymers, the emission is at longer wavelengths than the onset of significant absorption (the Stokes shift) resulting from inter- and intramolecular energy transfer. Thus there is minimal self-absorption of the emitted radiation [F. Hide et al., Science 273, 1833 (1996)], so self-absorption does not make the materials lossy. Moreover, since the absorption and emission are spectrally separated, pumping the excited state via the $\pi$ to $\pi^*$ transition does not stimulate emission, and an inverted population can be obtained at relatively low pump power.

Light-emitting diodes can be fabricated incorporating one or more layers of CPs, which may serve as conductive layers. Light can be emitted in various ways, e.g., by using one or more transparent or semitransparent electrodes, thereby allowing generated light to exit from the device.

The mechanism of operation of a polymer LED requires that carrier injection be optimized and balanced by matching the electrodes to the electronic structure of the semiconducting polymer. For optimum injection, the work function of the anode should lie at approximately the top of the valence band, $E_v$, (the $\pi$-band or highest occupied molecular orbital, HOMO) and the work function of the cathode should lie at approximately the bottom of the conduction band, $E_c$, (the $\pi^*$-band or lowest unoccupied molecular orbital, LUMO).

LED embodiments include hole-injecting and electron-injecting electrodes. A conductive layer made of a high work function material (above 4.5 eV) may be used as the hole-injecting electrode. Exemplary high work function materials include electronegative metals such as gold or silver, and metal-metal oxide mixtures such as indium-tin oxide. An electron-injecting electrode can be fabricated from a low work function metal or alloy, typically having a work function below 4.3. Exemplary low work function materials include indium, calcium, barium and magnesium. The electrodes can be applied by any suitable method; a number of methods are known to the art (e.g. evaporated, sputtered, or electron-beam evaporation).

In some embodiments, polymer light-emitting diodes have been fabricated using a semiconducting polymer cast from solution in an organic solvent as an emissive layer and a water-soluble (or methanol-soluble) conjugated copolymer as an electron-transport layer (ETL) in the device configuration: ITO(indium tin oxide)/PEDOT(poly(3,4-ethylene dioxythiophene)/emissive polymer/ETL/Ba/Al. The inventors have successfully fabricated multi-layer PLEDs using a semiconducting polymer (red, green or blue emitting), cast from solution in an organic solvent, as the emissive layer and a water-soluble (or methanol-soluble) cationic conjugated copolymer as electron-transport layer. The results demonstrate that devices with the ETL have significantly lower turn-on voltage, higher brightness and improved luminous efficiency.

Although the examples demonstrate the use of an electron-transport layer formed from the soluble conductive polymer, any form of conducting layer can be used. Thus, judicious choice of monomers as described herein can result in polymers with hole-injecting and/or transporting properties, as well as polymers with electron-injecting and/or transporting properties. The device geometry and deposition order can be selected based on the type of conductive polymer being used. More than one type of conductive polymer can be used in the same multilayer device. A multilayer device may include more than one layer of electron-injecting conjugated polymers, more than one layer of hole-injecting conjugated polymers, or at least one layer of a hole-injecting polymer and at least one layer of an electron-injecting conjugated polymer.

In PLEDs, the device efficiency is reduced by cathode quenching since the recombination zone is typically located near the cathode.[20] The addition of an ETL moves the recombination zone away from the cathode and thereby eliminates cathode quenching. In addition, the ETL can serve to block the diffusion of metal atoms, such as barium and calcium, and thereby prevents the generation of quenching centers[20] during the cathode deposition process.

In some embodiments, the principal criteria when a soluble conjugated polymer is used as an electron transport layer (ETL) in polymer light-emitting diodes (PLEDs) are the following: (1) The lowest unoccupied molecular orbital (LUMO) of the ETL must be at an energy close to, or even within the $\pi^*$-band of the emissive semiconducting polymer (so electrons can be injected); and (2) The solvent used for casting the electron injection material must not dissolve the underlying emissive polymer.

Similarly, the principal criteria for a polymer based hole transport layer (HTL) for use in polymer light-emitting diodes (PLEDs) is that the highest occupied molecular orbital (HOMO) of the HTL must be at an energy close to, or even within the valence band of the emissive semiconducting polymer.

Solubility considerations can dictate the deposition order of the particular CPs ans solvents used to produce a desired device configuration. Any number of layers of CPs with different solubilities may be deposited via solution processing by employing these techniques.

The PLEDs comprising CPs described herein can be incorporated in any available display device, including a full color LED display, a cell phone display, a PDA (personal digital assistant), portable combination devices performing multiple functions (phone/PDA/camera/etc.), a flat panel display including a television or a monitor, a computer monitor, a laptop computer, a computer notepad, and an integrated computer-monitor systems. The PLEDs may be incorporated in active or passive matrices.

EXAMPLES

The following examples are set forth so as to provide those of ordinary skill in the art with a complete description of how to make and use the present invention, and are not intended to limit the scope of what is regarded as the invention. Efforts have been made to ensure accuracy with respect to numbers used (e.g., amounts, temperature, etc.) but some experimental error and deviation should be accounted for. Unless otherwise indicated, parts are parts by weight, temperature is degree centigrade and pressure is at or near atmospheric, and all materials are commercially available.

Experimental

In one embodiment, polymer light-emitting diodes (PLEDs) have been fabricated using a semiconducting polymer cast from solution in an organic solvent as an emissive layer and a water-soluble (or methanol-soluble) conjugated copolymer as an electron-transport layer (ETL) in the device configuration: ITO/PEDOT/emissive polymers/ETL/Ba/Al. The results demonstrate that devices with the ETL have significantly lower turn-on voltage, higher brightness and improved luminous efficiency. See figures.

Example 1

Fabrication of PLEDs

The water soluble conjugated copolymer, poly{[9,9-bis(6'-(N,N,N-trimethylammonium)hexyl)-fluorine-2,7-diyl]-alt-[2,5-bis(p-phenylene)-1,3,4-oxadiazole])}(PFON$^+$(CH$_3$)$_3$I$^-$—PBD) was synthesized using the palladium catalyzed Suzuki coupling reaction[13,14] and used as an electron transport layer (ETL). Poly(9,9-dihexyl-fluorene-co-benzothiadiazole) (PFO-BT) was also synthesized using the Suzuki coupling reaction.[15] Poly(9,9-dioctyfluorenyl-2,7-diyl) (PFO) and poly[2-methoxy-5-(2-ethyl-hexyloxy)-1,4-phenylene vinylene] (MEH-PPV) were purchased from American Dye Source, Inc. (Canada). The molecular structures of PFO, PFO-BT, MEH-PPV and PFON$^+$(CH$_3$)$_3$I$^-$—PBD are shown below:

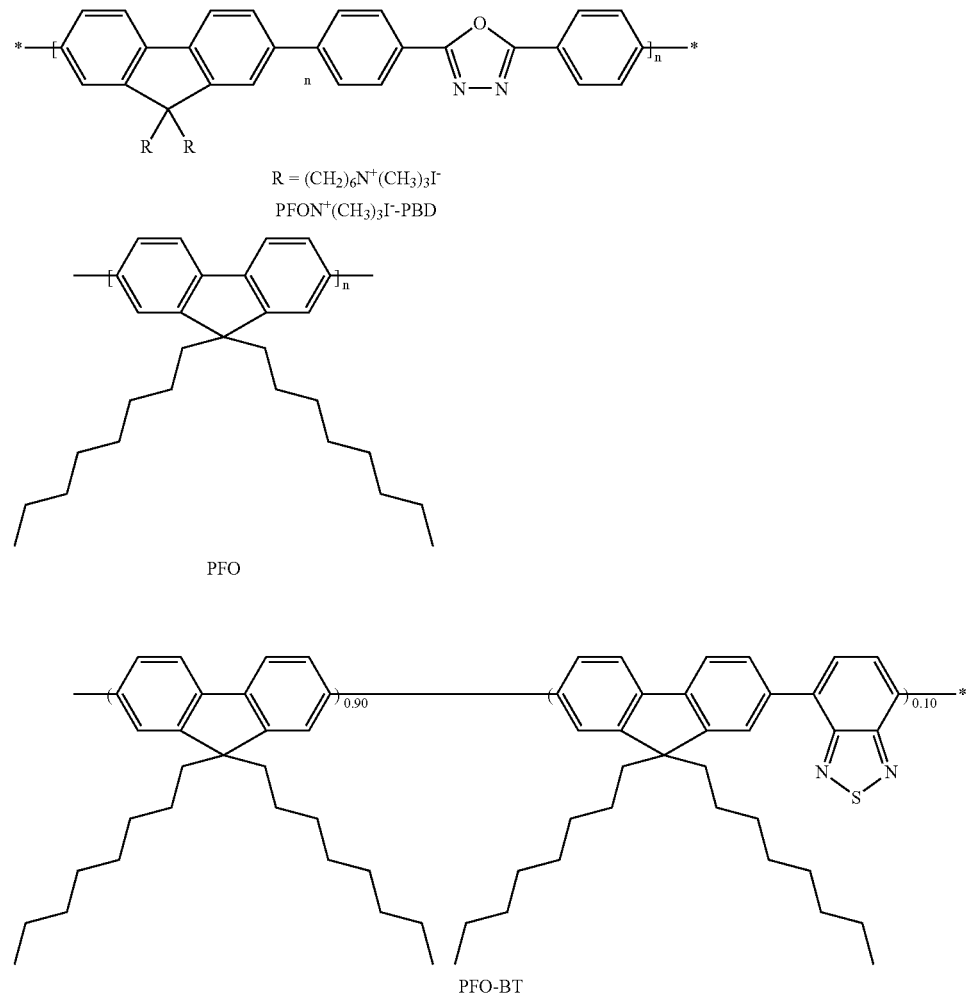

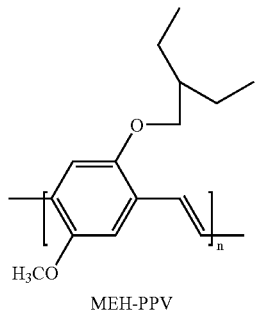

MEH-PPV

The HOMO (highest occupied molecular orbital) and LUMO energy levels are shown in FIG. 1 (the work functions of poly(3,4-ethylene dioxythiophene):poly(styrene sulfonic acid) (PEDOT:PSS) and barium are also shown for comparison). PEDOT:PSS on indium tin oxide (ITO) was used as the hole-injecting bilayer electrode. PLEDS were fabricated with and without the ETL layer in the following device structures: (ITO)/PEDOT:PSS/Emissive polymer/Ba/Al and (ITO)/PEDOT:PSS/Emissive Polymer/ETL/Ba/Al. Details of device fabrication and testing have been reported elsewhere; all fabrication steps were carried out inside a controlled atmosphere dry box under nitrogen atmosphere.[16,17] The ETL was deposited on top of the emissive layer by spin-casting from solution in methanol (0.6% wt.-%) to form a PFON$^+$(CH$_3$)$_3$I$^-$—PBD layer with thickness of approximately 30 nm and then annealed at 90° C. for 2 hours to remove residual solvent. Hydrophilic methanol was used as the solvent (rather than water) to achieve better inter-layer wetting while maintaining well-defined multi-layers. The term "emissive polymer/ETL" is used to designate devices with an ETL.

Example 2

Characterization of PLEDs Comprising a Water-Soluble CCP

Figure 2:
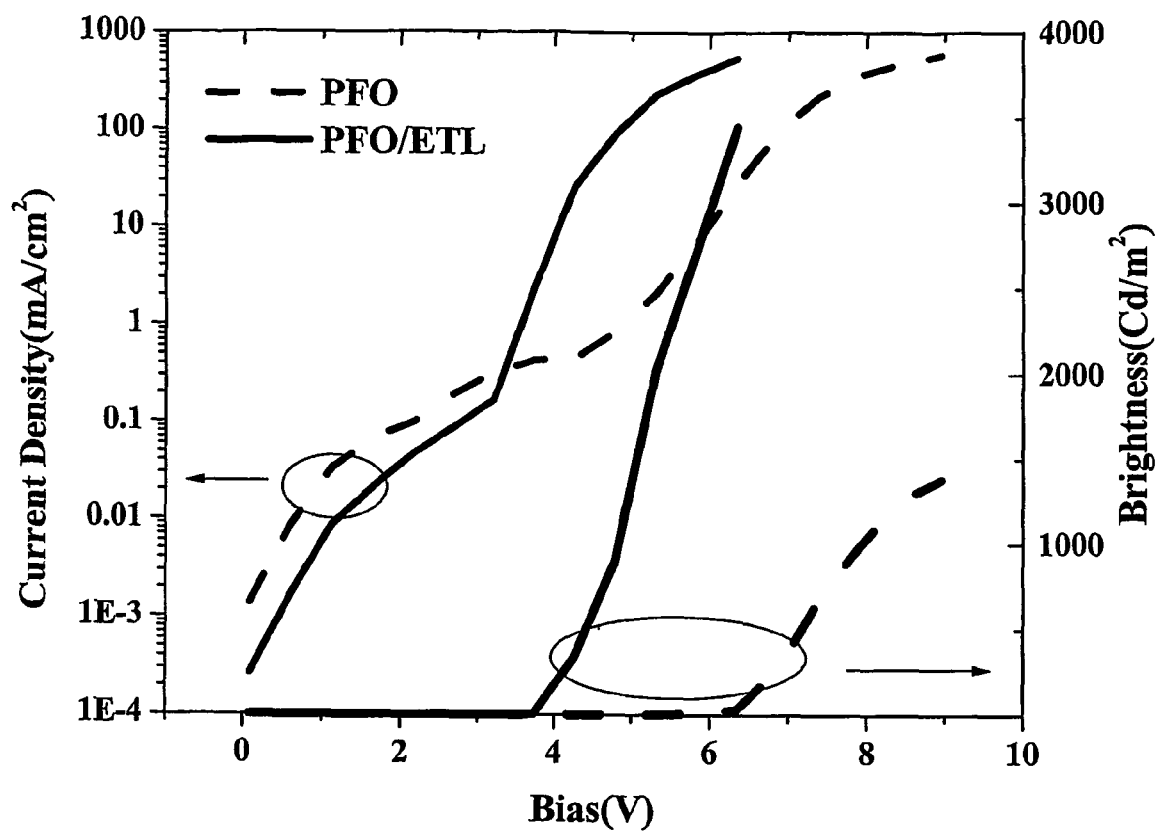
FIG. 2 shows the current density (mA/cm$^2$) vs. applied voltage (V) and luminance (cd/m$^2$) vs. applied voltage (V) for devices made using blue-emitting PFO with and without PFON$^+$(CH$_3$)$_3$I$^-$-PBD as an electron-transport layer (ETL).

FIG. 2 shows the current density vs. voltage and brightness vs. voltage characteristics of devices made using PFO with and without the ETL. The PFO/ETL devices turned on at ~3V (the turn-on voltage is defined as the voltage at the brightness of 0.1 cd/m$^2$), whereas the turn-on voltage is at ~5V for PFO devices made without the ETL.[18] At 6 V, the luminance (L) obtained from the PFO/ETL devices is L=3450 cd/m$^2$, compared to L=30 cd/m$^2$ for devices without the ETL.

Similar improvements were observed from the devices made with green and red emitting conjugated polymers. For MEH-PPV/ETL devices, L=5600 cd/m$^2$ at 5 V compared to L=3550 cd/m$^2$ for similar devices fabricated without the ETL. Therefore, the addition of the ETL results in lower turn-on voltage and higher brightness.

The dramatic improvement in brightness and the reduced turn-on voltage result from improved electron injection (there is a good match of the LUMO of the ETL to the π*-band of the emissive polymer(s)) and from the hole blocking capability of the ETL (LUMO energy at −6.24 eV relative to the vacuum).

Figure 3A:
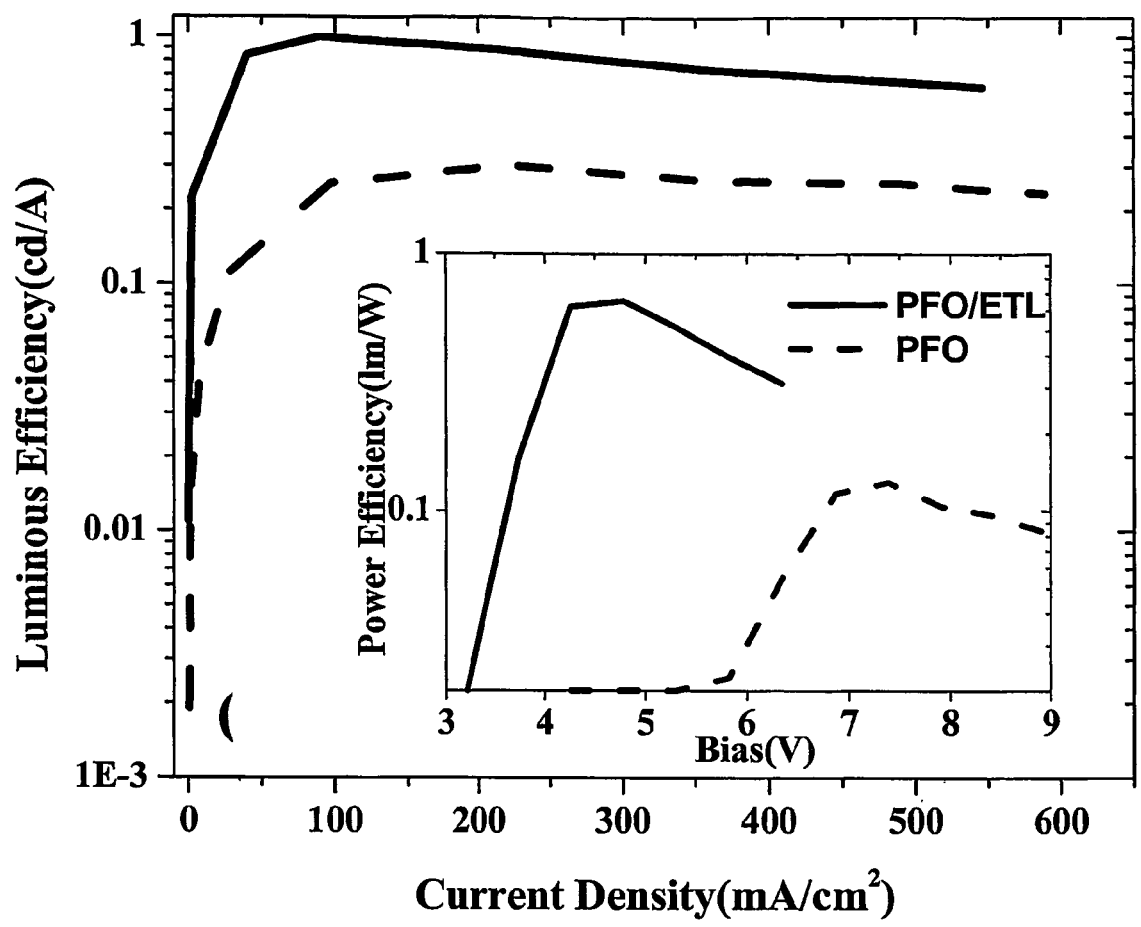
FIG. 3 shows the luminous efficiency (cd/A) as a function of current density (mA/cm$^2$) for devices made with (a) PFO, (b) PFO-BT and (c) MEH-PPV with and without ETL. Insets: (a) Power efficiency (lm/W) vs. bias (V) for devices made by PFO with and without ETL; (b) and (c) brightness (cd/m$^2$) vs. current density (mA/cm$^2$) for devices made by PFO-BT and MEH-PPV with and without ETL, respectively.
Figure 3B:
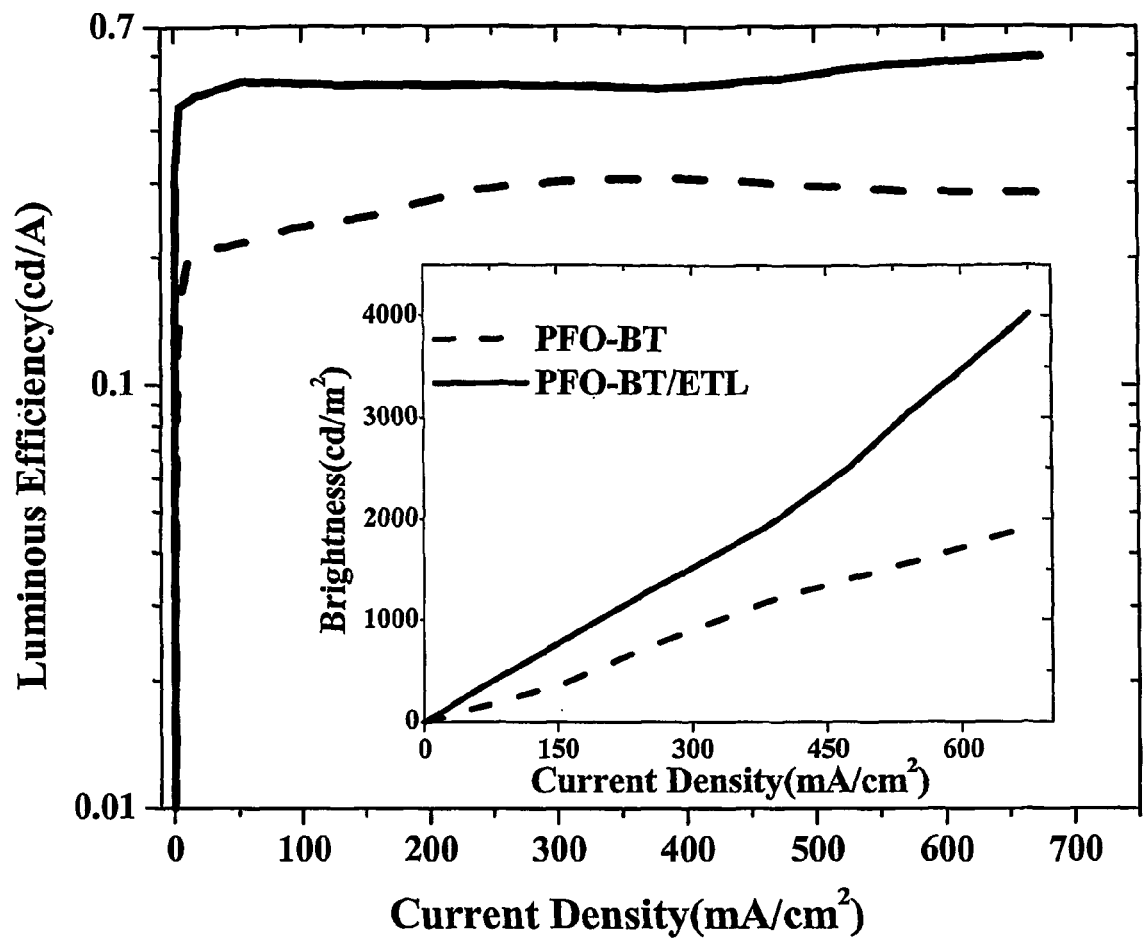
Figure 3C:
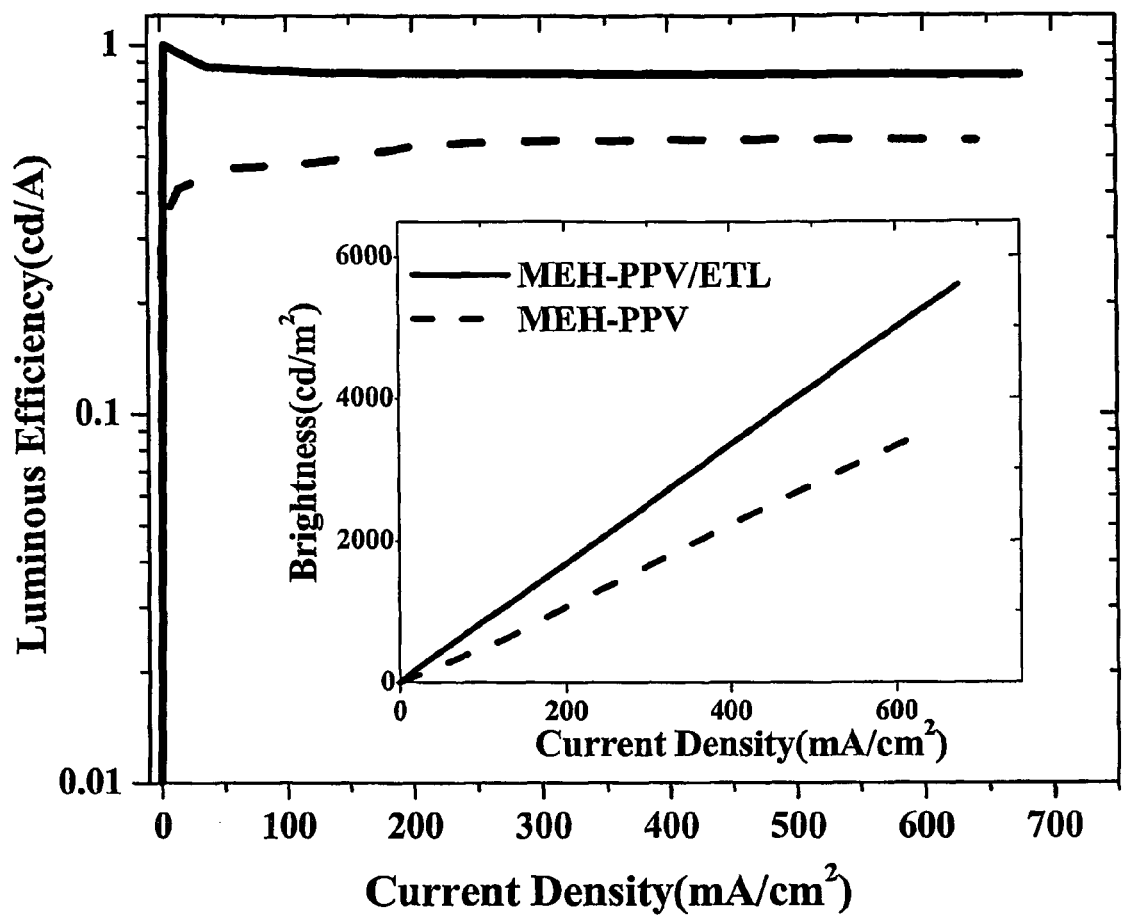

The luminous efficiency (LE in cd/A) vs. current density (J in mA/cm$^2$) for devices with and without the ETL are shown in FIGS. 3a, 3b and 3c. As shown in FIG. 3, devices with ETL have higher luminous efficiency, higher power efficiency, and correspondingly higher brightness at a given voltage.

The improvements in LE and PE can be understood in greater detail by comparing the LUMO energy level of the emissive polymer with that of PFON$^+$(CH$_3$)$_3$I$^-$—PBD and the work-function of barium (see FIG. 1). The energy barrier between the LUMO of PFO and the work function of barium is ~0.6 eV. Thus, by adding the PFON$^+$(CH$_3$)$_3$I$^-$—PBD layer as the ETL, electron injection is enhanced.

For PFO-BT and MEH-PPV, there is no energy barrier for electron injection. However, the hole-blocking feature of the PFON$^+$(CH$_3$)$_3$I$^-$—PBD layer leads to better balanced electron and hole currents. In addition, the enhanced electron injection can also facilitate hole injection.[21] Therefore, the larger and more nearly balanced electron and hole currents lead to higher luminous efficiencies in the devices with the ETL.

Figure 4:
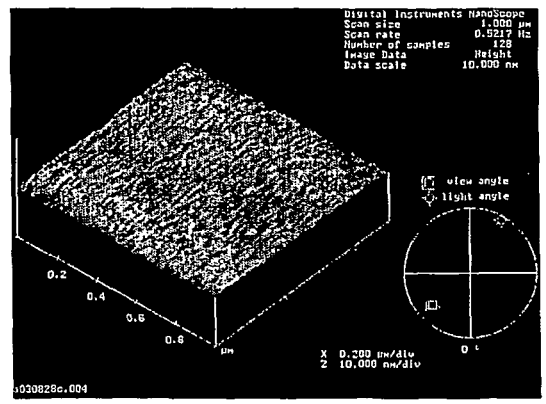
FIGS. 4 (a) and (b) are atomic force microscope (AFM) images show the surface of the ETL and that of the emissive polymer. The ETL layer provides an increased amount of features on the scale shown, providing more effective electron injection is achieved simply because of the increased contact area between ETL and cathode.
Figure 4:
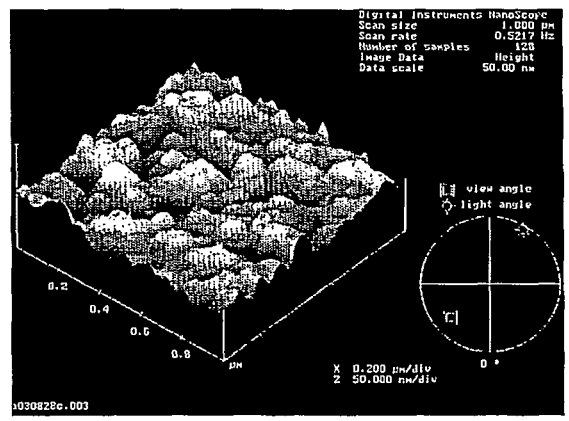

Interfacial energetics are known to play an important role in the emission characteristics of organic LEDs.[22][23] By adding the ETL between the cathode and the emissive polymer, the contacts at both interfaces are improved. Atomic force microscope (AFM) images show that the surface of the ETL is more rough than that of the emissive polymer. See FIG. 4. As a result, more effective electron injection is achieved simply because of the increased contact area between ETL and cathode.

Conclusion

The water- and methanol-soluble conjugated polymer, PFON$^+$(CH$_3$)$_3$I$^-$—PBD, was used as an electron-transporting layer in multi-layer PLEDs. By casting the ETL from solution in methanol and the emissive layer from solution in an organic solvent, interfacial mixing was avoided. Using blue, green or red emitting semiconducting polymers as the emissive layer and PFON$^+$(CH$_3$)$_3$I$^-$—PBD as the ETL, significant improvements in performance were demonstrated. More importantly, our results indicate that multi-layer PLEDs can be fabricated by deposition of multiple solutions.

Although the invention has been described in some detail with reference to the preferred embodiments, those of skill in the art will realize, in light of the teachings herein, that certain changes and modifications can be made without departing from the spirit and scope of the invention. Accordingly, the invention is limited only by the claims.

REFERENCES

[1] C. Tang, S. VanSlyke, *Appl. Phys. Lett.* 1987, 51, 913.
[2] J. Burroughes, D. Bradley, A. Brown, R. Marks, K. Mackay, R. Friend, P. Burn, A. Holmes, *Nature* 1990, 347, 539.
[3] N. S. Sariciftci, A. S. Heeger, in *Handbook of Organic Conductive Molecules and Polymers* (Ed: H. S, Nalwa), Wiley, UK 1997, Vol. 1, Ch. 8.

[4] D. D. C. Bradley M. *Synth. Met.* 1993, 54, 401.
[5] M. K. Fung, S. L. Lai, S. W. Tong, M. Y. Chan, C. S. Lee, and S. T. Lee. *Appl. Phys. Lett.* 2001, 81, 1497.
[6] H. Yan, Q. Huang, J. Cui, J. G. C. Veinot, M. M. Kern, T. J. Marks, Adv. Mater. 2003, 15, 835.
[7] X. Gong, D. Moses, and A. J. Heeger. Appl. Phys. Lett. 2003, 83, 183.
[8] T. M. Brown, R. H. Friend, I. S. Millard, D. J. Lacey, J. H. Burroughes, and F. Cacialli *Appl. Phys. Lett.* 2001, 79, 174.
[9] M. Y. Chan, S. L. Lai, M. K. Fung, S. W. Tong, C. S. Lee, and S. T. Lee *Appl. Phys. Lett.* 2003, 82, 1784.
[10] L. S. Hung, C. H. Chen. *Mater. Sci. And Eng.,* 2002, R39, 143.
[11] M. Hwang, M. Hua, S. Chen, *Polymer* 1999, 40, 3233.
[12] Y. Yang and Q. Pei. *J. Appl. Phys.* 1995, 77 4807
[13] X. Zhan, Y. Liu, X. Wu, S. Wang, and D. Zhu, *Macro,* 2002, 35, 2529.
[14] P. Iyer, G. C. Bazan, to be published.
[15] J. Hunag, Y. H. Niu, W. Yang, Y. Q. Mo, M. Yuan, Y. Cao, Macro. 2002, 35, 6080.
[16] X. Gong, J. C. Ostrowsld, G. C. Bazan, D. Moses, and A. J. Heeger, *Adv. Func. Mater.* 2003, 13, 439.
[17] X. Gong, J. C. Ostrowski, M. R. Robinson, D. Moses, G. C. Bazan, and Alan J. Heeger. *Adv. Mat.* 2002, 14, 581.
[18] M. T. Bernius, M. Inbasekaran, J. O'Brien, W. S. Wu, *Adv. Mater.,* 2000, 12, 1737.
[19] D. O'Brien, M. S. Weaver, D. G. Lidzey, and D. D. C. Bradley. *Appl. Phys. Lett.* 1996. 69, 881.
[20] V.-E. Choong, Y. Park, Y. Gao, T. Wehrmeister, K. Müllen, B. R. Hsieh, and C. W. Tang, *Appl Phys. Lett.* 1996. 69, 1492.
[21] K. Murata, S. Cina, and N. C. Greenham, *Appl. Phys. Lett.* 2001.79, 1193.
[22] J. Cui, Q. Huang, J. G. C. Veinot, H. Yan, T. J. Marks. *Adv. Mater.* 2002, 14, 565.
[23] N. C. Greenham, S. C. Moratti, D. D. C. Bradley, R. H. Friend & A. B. Holmes. *Nature,* 1993. 365, 628.
[24] P. E. Burrows, V. Bulovic, S. R. Forrest, L. S. Sapochak, D. M. McCarty, and M. E. Thompson, *Appl. Phys. Lett.* 1994. 65, 2922.
[25] L. M. Do, E. M. Han, Y. Niidome, and M. Fujihira. T. Kanno, S. Yoshida, A. Maeda, and A. J. Ikushima J. *Appl. Phys. Lett.* 1996. 76, 5118.
[26] J. McElvain, H. Antoniadis, M. R. Hueschen, J. N. Miller, D. M. Roitman, J. R. Sheats, and R. L. Moon, *J. Appl. Phys.* 1996, 80, 6002.
[27] S. Liu, X. Z. Jiang, H. Ma, M. S. Liu, and A. K.-Y. Jen, *Macro.,* 2000. 33, 3514.
[28] Baur, J. W.; Kim, S. H.; Balanda, P. B.; Reynolds, J. R.; Rubner, M. F. Thin-Film light-emitting devices based on sequentially adsorbed multilayers of water-soluble poly(p-phenylene)s. Adv. Mater. 1998, 10, 1452.

What is claimed is:

1. A method of forming adjacent layers of materials on a substrate, comprising:
   providing a first solution comprising a first material that is a water-soluble cationic conjugated polymer and a first solvent, wherein the conjugated polymer comprises polar groups as pendant solubilizing groups covalently bonded to the conjugated polymer;
   providing a second solution comprising a second material including an emissive semiconducting polymer and a second solvent;
   depositing a first layer of one of said first and second solutions onto a substrate;
   depositing a second layer of the other of said first and second solutions onto the first layer;
   wherein the material deposited in the first layer does not dissolve in the solvent deposited in the second layer, and the water-soluble cationic conjugated polymer has a highest occupied molecular orbital at an energy within the valence band of the emissive semiconducting polymer, or the water-soluble cationic conjugated polymer has a lowest unoccupied molecular orbital at an energy within the conduction band of the emissive semiconducting polymer.

2. The method of claim 1, wherein the first solvent comprises water.

3. The method of claim 1, wherein the first solution comprises a detergent.

4. The method of claim 1, wherein depositing the first solution onto the substrate comprises spin-casting.

5. The method of claim 1, wherein the substrate is a film.

6. The method of claim 1, wherein the substrate is rigid.

7. A method of adding a polymer layer to a substrate, comprising:
   providing a first solution of a cationic water-soluble conjugated polymer in a solvent, wherein the conjugated polymer comprises polar groups as pendant solubilizing groups covalently bonded to the conjugated polymer;
   providing a substrate comprising an emissive semiconducting polymer not soluble in the solvent;
   depositing the first solution on the substrate;
   wherein the water-soluble cationic conjugated polymer has a highest occupied molecular orbital at an energy within the valence band of the emissive semiconducting polymer, or the water-soluble cationic conjugated polymer has a lowest unoccupied molecular orbital at an energy within the conduction band of the emissive semiconducting polymer.

8. The method of claim 7, wherein the solvent comprises water.

9. The method of claim 7, wherein depositing the first solution onto the substrate comprises spin-casting.

10. The method of claim 7, wherein the substrate is a film.

11. The method of claim 7, wherein the substrate is rigid.

* * * * *